(12) United States Patent
Waterfield

(10) Patent No.: US 6,719,266 B2
(45) Date of Patent: Apr. 13, 2004

(54) PIEZOELECTRIC VALVE SYSTEM

(75) Inventor: L. Glenn Waterfield, Peoria, IL (US)

(73) Assignee: Caterpillar Inc, Peoria, IL (US)

( * ) Notice: Subject to any disclaimer, the term of this patent is extended or adjusted under 35 U.S.C. 154(b) by 0 days.

(21) Appl. No.: 10/349,845

(22) Filed: Jan. 23, 2003

(65) Prior Publication Data

US 2003/0226990 A1 Dec. 11, 2003

Related U.S. Application Data

(62) Division of application No. 10/164,463, filed on Jun. 6, 2002.

(51) Int. Cl.$^7$ ................................................ F16K 31/02
(52) U.S. Cl. ................... 251/129.06; 310/368; 239/524
(58) Field of Search ........................... 239/102.1, 102.2, 239/585.1, 589; 251/129.06, 33, 11; 123/498; 310/328, 368, 371

(56) References Cited

U.S. PATENT DOCUMENTS 4,629,926 A * 12/1986 Siegal ........................ 310/331
5,589,725 A * 12/1996 Haertling .................... 310/358
6,326,717 B1 12/2001 Mattes
6,376,969 B1 4/2002 Forck

FOREIGN PATENT DOCUMENTS

FR 2 775 525 9/1999

* cited by examiner

Primary Examiner—Edward K. Look
Assistant Examiner—John K Fristoe, Jr.
(74) Attorney, Agent, or Firm—Wood, Herron & Evans LLP; Kelsey L Milman

(57) ABSTRACT

A valve system having a valve operated by a piezoelectric device to control the flow of fluid through the valve system. Movement of the valve is controlled by a pre-stressed bender actuator that changes its shape by deforming in opposite axial directions in response to a control signal applied by an actuator control system. The valve system may comprise a common rail fuel injector, electrohydraulic actuator system, electronically-controlled fuel injector, gasoline port injector, fluid metering valve, relief valve, reducing valve, direct valve or direct-injection gasoline injector.

14 Claims, 18 Drawing Sheets

PIEZOELECTRIC VALVE SYSTEM

This application is a divisional of application Ser. No. 10/164,463, titled Piezoelectric Valve System file on Jun. 6, 2002.

TECHNICAL FIELD

The present invention relates generally to valve systems for controlling a flow of fluid through a fluid passageway and, more particularly, to a valve system having a valve actuated by a piezoelectric device to control the flow of fluid through the valve system.

BACKGROUND

Valve systems have been designed in the past having a valve actuated by a solenoid, piezoelectric stack or magnetorestrictive rod to control the flow of fluid through the valve system. The valve system may comprise a common rail fuel injector, electrohydraulic actuator system, electronically-controlled fuel injector, gasoline port injector, fluid metering valve, relief valve, reducing valve, direct valve or direct-injection gasoline injector by way of example.

However, in solenoid-controlled valve systems, it is often difficult to accurately control movement and positioning of the valve through the control signals applied to the solenoids. This is especially true when intermediate positioning of a solenoid-controlled valve between two opposite, fixed positions is desired. Solenoid-controlled valves, by their very nature, are susceptible to variability in their operation due to inductive delays, eddy currents, spring preloads, solenoid force characteristics and varying fluid flow forces. Each of these factors must be considered and accounted for in a solenoid-controlled valve system design. Moreover, the response time of solenoids limits the minimum possible dwell times between valve actuations and makes the valve system generally more susceptible to various sources of variability.

While solenoids provide large forces and have long strokes, solenoids do have certain drawbacks. For example, first, during actuation, current must be continuously supplied to the solenoid in order to maintain the solenoid in its energized position. Further, to overcome the inertia of the armature and provide faster response times, a solenoid is driven by a stepped current waveform. A very large current is initially provided to switch the solenoid; and after the solenoid has changed state, the drive current is stepped down to a minimum value required to hold the solenoid in that state. Thus, a relatively complex and high power current driver is required.

In addition to requiring a relatively complex and high current power source, the requirement of continuous current flow to maintain the solenoid at its energized position leads to heating of the solenoid. The existence of such a heat source, as well as the ability to properly dissipate the heat, is often of concern depending on the environment in which the solenoid is used.

Additionally, the force produced by a solenoid is dependent on the air gap between the armature and stator and is not easily controlled by the input signal. This makes the solenoid difficult to use as a proportional actuator. Large proportional solenoids are common, but they operate near or at the saturation point and are very inefficient. Small, relatively fast acting non-proportional solenoids may have response times defined by the armature displacement as fast as 350 microseconds. However, this response time can be a significant limitation in some applications that require high repetition valve actuation rates or closely spaced events. Further, it is known that there is a substantial delay between the start of the current signal and the start of the armature motion. This is due to the inductive delay between the voltage and magnetic flux required to exert force on the armature. In valve systems, such delays lead to variability.

Electroactive actuators such as piezoelectric stacks and magnetorestrictive rods eliminate the response time and proportionality shortcomings of the solenoid. The piezoelectric stacks, due to their capacitive behavior, offer the benefit of drawing no power during "hold in", where actuation is maintained for a long period of time. However, these actuators have shortcomings of their own. Piezoelectric stacks and magnetorestrictive actuators possess impressive force, but have very small stoke capabilities. The output of these actuators must then be mechanically or hydraulically amplified, limiting the response time and proportionality benefits that they offer. Because of their small strain capabilities, these actuators also tend to be large. Additionally, these actuators are uni-directional, i.e., they move in only one direction in response to a control signal. Therefore, any valve or mass moved by the actuator requires a return biasing force, such as by a return spring, to be applied to return the valve or mass to its original position. Often, the spring comprises a significant amount of the force required to move the valve or mass and represents another source of variability. Also, the beneficial response time of the actuator will have no impact on the return of the valve or mass, as it depends completely on the return spring.

Thus, the present invention is directed to overcoming one or more of the problems set forth above.

SUMMARY OF THE INVENTION

While the invention is described in connection with certain embodiments, it will be understood that the invention is not limited to these embodiments. On the contrary, the invention includes all alternatives, modifications and equivalents as may be included within the spirit and scope of the present invention.

In accordance with one embodiment of the present invention, a valve system, such as a common rail fuel injector by way of example, includes a valve body and a fluid chamber disposed within the valve body. The fluid chamber is adapted to communicate with a fluid source for containing fluid therein. A fluid orifice communicates with the fluid chamber. A valve member mounted within the valve body is movable between a closed position for closing the fluid orifice and an open position for opening the fluid orifice. A pre-stressed bender actuator operatively engages the valve member and is operable to selectively move the valve member to at least one of the closed and open positions to close and open the fluid orifice.

In accordance with another embodiment of the present invention, a valve system, such as a common rail fuel injector by way of example, includes a valve body and a fluid chamber disposed within the valve body. The fluid chamber is adapted to communicate with a fluid source for containing fluid therein. A fluid orifice communicates with the fluid chamber. A control fluid chamber is disposed within the valve body and is adapted to communicate with a fluid source for containing fluid therein. The control fluid chamber is also adapted to selectively communicate with a drain for draining fluid from the control fluid chamber. A valve member is mounted within the valve body and is movable between a closed position for closing the fluid orifice and an open position for opening the fluid orifice. The valve member moves between the open and close positions in response to a difference in fluid pressure in the fluid chamber and in the control fluid chamber. A control valve member is mounted within the valve body and is operable to move between a closed position for containing fluid within the control fluid chamber and an open position for draining fluid from the control fluid chamber. A pre-stressed bender actuator operatively engages the control valve member and is operable to selectively move the control valve member to at least one of the closed and open positions.

In accordance with yet another embodiment of the present invention, an apparatus is provided for adjusting a preload of a piezoelectric device having first and second opposed surfaces and a peripheral edge extending therebetween. The apparatus includes a clamping device configured to engage the first and second opposed surfaces of the piezoelectric device proximate the peripheral edge thereof. The clamping device is operable to apply a variable clamping force to the piezoelectric device. A load device operatively engages the clamping device and is operable to vary the applied clamping force to adjust the preload of the piezoelectric device.

In accordance with still yet another embodiment of the present invention, a valve system, such as a gasoline port injector or direct-injection gasoline injector by way of example, includes a valve body having a fluid inlet adapted to communicate with a fluid source and a fluid outlet adapted to emit fluid. A fluid passageway extends through the valve body between the fluid inlet and the fluid outlet. A valve member is mounted at least partially in the fluid passageway and is movable between a closed position for closing the fluid orifice and an open position for opening the fluid orifice. A pre-stressed bender actuator operatively engages the valve member and is operable to selectively move the valve member to at least one of the closed and open positions to close and open the fluid orifice.

In accordance with another alternative embodiment of the present invention, a fluid metering valve includes a fluid reservoir chamber adapted to communicate with a fluid source for containing fluid therein. A fluid outlet communicates with the fluid reservoir chamber. A plunger member is mounted for selective movement in the fluid reservoir chamber and is operable to meter a volume of fluid from the fluid orifice upon movement of the plunger member toward the fluid outlet. A pre-stressed bender actuator operatively engages the plunger member and is operable to selectively move the plunger member toward the fluid outlet to meter the volume of fluid from the fluid orifice.

In accordance with still yet another embodiment of the present invention, a fluid metering valve includes a fluid reservoir chamber adapted to communicate with a fluid source for containing fluid therein. A fluid outlet communicates with the fluid reservoir chamber. A pre-stressed bender actuator is operable to act directly on the fluid contained in the fluid reservoir chamber so that a volume of fluid is metered from the fluid outlet upon actuation of the bender actuator toward the fluid outlet.

In accordance with still yet another embodiment of the present invention, a fluid metering valve includes an inlet fluid passage adapted to communicate with a fluid source for carrying fluid therein. An outlet fluid passage communicates with the inlet fluid passage. A valve seat is disposed at a juncture of the inlet fluid passage and the outlet fluid passage. A valve member is mounted for selective movement relative to the valve seat between a closed position for closing fluid communication between the inlet fluid passage and an open position for opening fluid communication between the fluid inlet passage and the fluid outlet passage to meter a volume of fluid through the outlet fluid passage. A pre-stressed bender actuator operatively engages the valve member and is operable to selectively move the valve member to at least one of the open and closed positions.

In accordance with yet another alternative embodiment of the present invention, a fluid metering valve includes an inlet fluid passage adapted to communicate with a pressurized fluid source for carrying pressurized fluid therein. A sensor is operable to detect a fluid pressure in the inlet fluid passage. An outlet fluid passage communicates with the inlet fluid passage. A valve seat is disposed at a juncture of the inlet fluid passage and the outlet fluid passage. A valve member is mounted for selective movement relative to the valve seat between a closed position for closing fluid communication between the inlet fluid passage and the outlet fluid passage and an open position for opening fluid communication between the inlet fluid passage and the outlet fluid passage to regulate a fluid pressure in the inlet fluid passage. A pre-stressed bender actuator operatively engages the valve member and is operable to selectively move the valve member to at least one of the open and closed positions in response to a detected fluid pressure in the inlet fluid passage by the sensor.

In accordance with still yet another embodiment of the present invention, a valve system includes a fluid chamber and a fluid passage communicating with the fluid chamber. A fluid aperture is disposed at the juncture of the fluid chamber and the fluid passage. A pre-stressed bender actuator is operable to act directly on the fluid aperture between a closed position for closing fluid communication between the fluid chamber and the fluid passage and an open position for opening fluid communication between the fluid chamber and the fluid passage.

DETAILED DESCRIPTION

Figure 1:
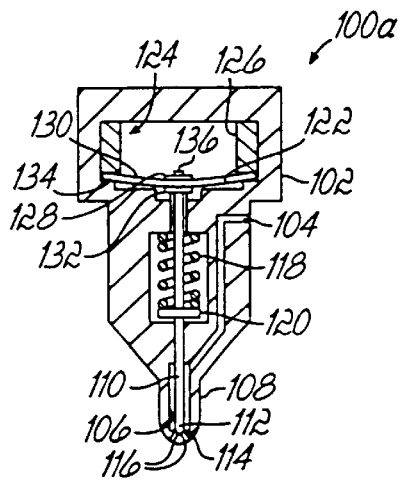
FIG. 1 is a schematic cross-sectional view illustrating a common rail fuel injector in accordance with one embodiment of the present invention.

With reference to the Figures, and to FIG. 1 in particular, a common rail fuel injector 100a is shown in accordance with the principles of the present invention. Fuel injector 100a includes a valve body 102 having a high-pressure fluid rail 104 extending through the body 102 that communicates with a fluid chamber 106 formed in the injector tip 108. An elongated needle valve 110 is mounted to extend axially through the valve body 102 and includes a valve tip 112 that normally seats in a valve seat 114 to close fluid orifices 116 formed at the remote end of the injector tip 108. The needle valve 110 is biased to the closed position by a biasing element, such as by a return spring 118, that acts on an annular flange 120 extending radially outwardly from the needle valve 110.

The needle valve 110 is mounted for reciprocal movement within the valve body 102 for selectively opening and closing the orifices 116 so that fuel may be injected into an engine combustion chamber or cylinder of a combustion engine (not shown).

In accordance with one embodiment of the present invention, as shown in FIG. 1, the needle valve 110 is connected to at least one piezoelectric device 122, such as a pre-stressed electroactive bender actuator, which may be thermally, mechanically or otherwise pre-stressed, that changes its shape by deforming in opposite axial directions in response to a control signal applied by an electronic control module ECM (not shown). The control signal may be a voltage signal applied by the ECM to the bender actuator 122 through a pair of electrical leads (not shown). Alternatively, the bender actuator 122 may be controlled by a current control signal as is known in the art.

The bender actuator 122 preferably has a cylindrical or disk configuration and includes at least one electroactive layer (not shown) positioned between a pair of electrodes (not shown), although other configurations are possible as well without departing from the spirit and scope of the present invention. In a de-energized or static state, the bender actuator 122 is preferably pre-stressed to have a domed configuration as shown in FIG. 1. When the electrodes (not shown) of the bender actuator 122 are energized to place the bender actuator 122 in an actuated state, such as when a voltage or current control signal is applied by the ECM (not shown), the bender actuator 122 displaces axially by flattening out from the domed configuration. In particular, the bender actuator 122 displaces axially, i.e., flattens out, in one direction when it is actuated in response to a control signal of one polarity. In a de-energized state, or in response to a control signal of an opposite polarity, the bender actuator 122 displaces axially, i.e., returns to its domed configuration, in an opposite direction. The applied control signal may even cause the bender actuator 122 to dome to a greater extent beyond its static domed configuration. The bender actuator 122 is therefore bi-directional in its operation. The bender actuator 122 may be a model TH-5C actuator commercially available from Face International, Inc. of Norfolk, Va. Other appropriate bender actuators may also be used.

Bender actuator 122 may comprise a plurality of benders actuators (configured in parallel or in series) that are individually stacked or bonded together into a single multi-layered element. While not shown, those of ordinary skill in the art will appreciate that multiple bender actuators 122 may be mounted in parallel within the valve body 102 to increase the force applied by the bender actuators 122 to the needle valve 110 in response to a control signal applied by the ECM (not shown). Alternatively, the bender actuators 122 may be mounted in series to increase the stroke of the needle valve 110 upon axial displacement of the bender actuators 122 in response to the control signal.

The bender actuator 122 is mounted within the valve body 102 by a clamping and load ring assembly, illustrated diagrammatically at 124. The structure and operation of the clamping and load ring assembly 124 will be described in detail below in connection with FIGS. 7A, 7B, 8 and 11. Briefly, the assembly 124 includes upper and lower clamping rings (not shown) that support the bender actuator 122 at its peripheral edge between the pair of clamping rings.

A load ring 126 of the assembly 124 is used to preload or prestress the bender actuator 122 to a predetermined spring constant and/or axial displacement by adjusting the clamping force applied to the bender actuator 122 by the pair of clamping rings (not shown). Increasing the clamping force on the bender actuator 122 reduces an axial displacement of the bender actuator 122 to a control signal of predetermined magnitude. Conversely, decreasing the clamping force results in a greater axial displacement of the bender actuator 122 to the control signal of predetermined magnitude.

As shown in FIG. 1, the needle valve 110 is connected to the bender actuator 122 so that the needle valve 110 will travel axially within the valve body 102 upon axial displacement of the bender actuator 122 from the domed, or unactuated configuration shown in FIG. 1 to a flattened, or actuated position (not shown). In one embodiment of the present invention, the needle valve 110, or at least a portion thereof adjacent to the bender actuator 122, is preferably made from an electrically nonconducting material, such as zirconia for example. As will be appreciated, the needle valve 110 may be fabricated of other electrically insulating materials known to those skilled in the art. Alternatively, the end of the needle valve 110 adjacent the bender actuator 122 may be constructed to have an electrically nonconductive end.

In accordance with one embodiment, connection of the needle valve 110 with the bender actuator 122 is achieved by forming a hole (not shown) near the center of the bender actuator 122. An electrically nonconductive sleeve (not shown) having an electrically nonconductive annular flange 128 is inserted through the hole (not shown) so that the flange 128 contacts a major surface 130 of the bender actuator 122. An electrically nonconductive washer 132 is mounted in contact with an opposite major surface 134 of the bender actuator 122. An electrically conductive fastener 136, such as a screw, is inserted through the nonconductive sleeve (not shown) and threadably engaged with one end of the needle valve 110. Alternatively, an electrically nonconductive fastener 136 may be inserted directly through the hole (not shown) in the bender actuator 122 to threadably connect with one end of the needle valve 110. As will be appreciated, instead of using a fastener 136, the end of the needle valve 110 may be rigidly connected to the bender actuator 122 by adhesives, bonding or attaching by other means. With the bender actuator 122 rigidly connected to the needle valve 110, the bender actuator 122 is capable of moving the needle valve 110 bidirectionally with the bidirectional operation of the bender actuator 122. While not shown, it will be appreciated that needle valve 110 may not be rigidly connected to the bender actuator 122. Rather, one end of the needle valve 110 remote from the valve tip 112 engages major surface 134 of the bender actuator 122 so that the needle valve 110 will travel axially within the valve body 102 upon axial displacement of the bender actuator 122 from the domed or unactuated configuration shown in FIG. 1 to a flattened, or actuated position (not shown).

In operation of the common rail fuel injector 100a, the return spring 118 biases the needle valve 110 to a closed position so that the valve tip 112 seats in the valve seat 114 to close the orifices 116. Fuel is delivered to the fluid chamber 106 under pressure through the high pressure rail 104. During an injection cycle, the ECM (not shown) applies a control signal to the bender actuator 122 that causes the bender actuator 122 to deform or displace axially by flattening out. As the bender actuator 122 flattens out in response to the control signal, the needle valve 110, by virtue of its rigid connection to the bender actuator 122, lifts off of the valve seat 114 against the force of return spring 118 to open the orifices 116 for an injection of fuel. After the injection cycle is complete, the control signal is either discontinued, or the polarity of the control signal is reversed, to cause the bender actuator 122 to return to its domed configuration as shown in FIG. 1. The return spring 118 assists in returning the needle valve 110 to its closed position in contact with valve seat 114 to seal the orifices 116.

Figure 2:
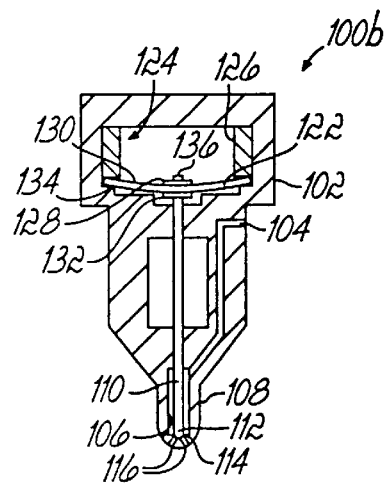
FIG. 2 is a view similar to FIG. 1 illustrating a common rail fuel injector in accordance with a second embodiment of the present invention.

Referring now to FIG. 2, a common rail fuel injector 100b is shown in accordance with an alternative second embodiment of the present invention, where like numerals represent like parts to the common rail fuel injector 100a of FIG. 1. In this embodiment, the return spring 118 is eliminated so that the bi-directional operation of the bender actuator 122 is used to move the needle valve 110 to both its open and closed positions. The spring rate of the bender actuator 122 may be adjusted by the clamping and load ring assembly 124 to pre-load the needle valve 110 against the valve seat 114. Alternatively, the spring rate of the bender actuator 122 may be controlled by the material and/or thickness selection of the bender actuator 122. During an injection cycle, the bender actuator 122 is energized to move the needle valve 110 to its open position as described in detail above. After the injection cycle is complete, the polarity of the control signal is preferably reversed to cause the bender actuator 122 to return to its domed configuration as shown in FIG. 2 and thereby return the needle valve 110 to its closed position in contact with valve seat 114 to seal the orifices 116.

Figure 3:
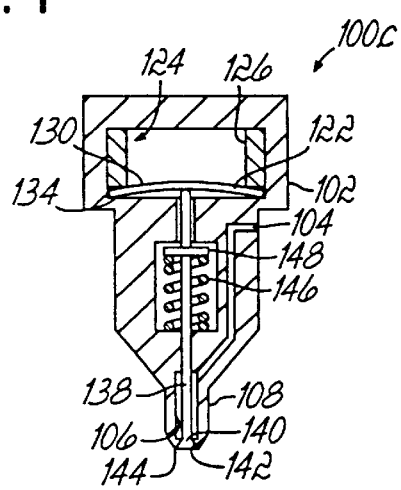
FIG. 3 is a view similar to FIG. 1 illustrating a common rail fuel injector in accordance with a third embodiment of the present invention.

Referring now to FIG. 3, a common rail fuel injector 100c is shown in accordance with an alternative third embodiment of the present invention, where like numerals represent like parts to the common rail fuel injector 100a of FIG. 1. In this embodiment, the fuel injector 100c includes the high-pressure fluid rail 104 extending through the valve body 102 that communicates with the fluid chamber 106 formed in the injector tip 108. An outwardly opening, elongated check valve 138 is mounted to extend axially through the valve body 102 and includes a closing head 140 that normally seats in a conically-shaped valve seat 142 to close a fluid orifice 144 formed at the remote end of the injector tip 108.

The check valve 138 is biased to the closed position by a biasing element, such as by a return spring 146, that acts on an annular flange 148 extending radially outwardly from the check valve 138. The check valve 138 is mounted for reciprocal movement within the valve body 102 for selectively opening and closing the orifice 144 so that fuel may be injected into an engine combustion chamber or cylinder of a combustion engine (not shown).

In this embodiment, one end of the check valve 138 remote from the closing head 140 engages at least one bender actuator 122. The check valve 138 engages the bender actuator 122 so that the check valve 138 will travel axially within the valve body 102 upon axial displacement of the bender actuator 122 from the domed, or unactuated configuration shown in FIG. 3 to a flattened, or actuated position (not shown).

In operation of the common rail fuel injector 100c, the return spring 146 biases the outwardly opening check valve 138 to a closed position so that the closing head 140 seats in the conically-shaped valve seat 142 to close the orifice 144.

Fuel is delivered to the fluid chamber 106 under pressure through the high pressure rail 104. During an injection cycle, the ECM (not shown) applies a control signal to the bender actuator 122 that causes the bender actuator 122 to deform or displace axially by flattening out. As the bender actuator 122 flattens out in response to the control signal, the check valve 138, by virtue of its engagement with the bender actuator 122, is pushed off of the conically-shaped valve seat 142 against the force of return spring 146 to open the orifice 144 for an injection of fuel. After the injection cycle is complete, the control signal is either discontinued, or the polarity of the control signal is reversed, to cause the bender actuator 122 to return to its domed configuration as shown in FIG. 3. The return spring 146 assists in returning the check valve 138 to its closed position so that the closing head 140 engages the conically-shaped valve seat 142 to seal the orifice 144.

Figure 4:
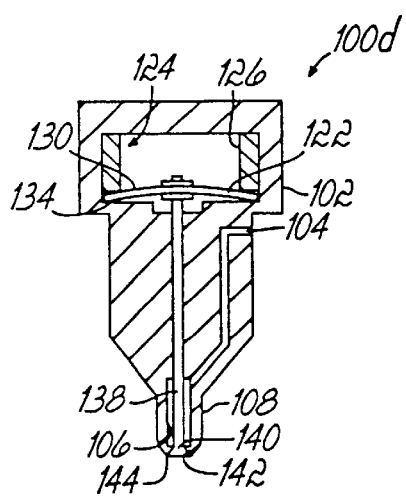
FIG. 4 is a view similar to FIG. 1 illustrating a common rail fuel injector in accordance with a fourth embodiment of the present invention.

Referring now to FIG. 4, a common rail fuel injector 100d is shown in accordance with an alternative fourth embodiment of the present invention, where like numerals represent like parts to the common rail fuel injector 100c of FIG. 3. In this embodiment, the elongated check valve 138 is rigidly connected to the bender actuator 122 as described in detail above in connection with FIG. 1 so that the bi-directional operation of the bender actuator 122 is used to move the check valve 138 to both its open and closed positions. The rigid connection of the check valve 138 to the bender actuator 122 permits the return spring 146 to be eliminated so that the bender actuator 122 provides the necessary force to return the check valve 138 to its closed position. As described in detail above, the spring rate of the bender actuator is adjusted by the clamping and load ring assembly 124 to pre-load the check valve 138 against the conically-shaped valve seat 142.

Figure 5:
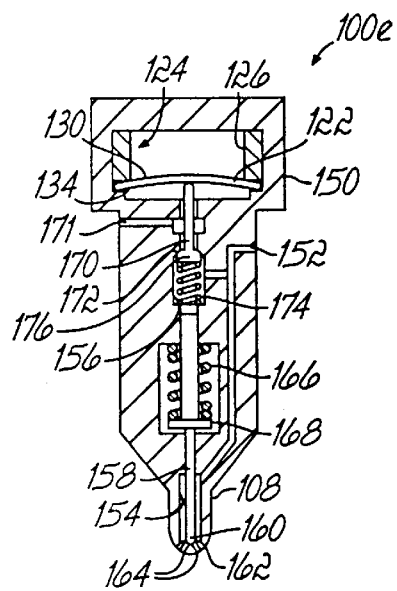
FIG. 5 is a view similar to FIG. 1 illustrating a common rail fuel injector in accordance with a fifth embodiment of the present invention.

Referring now to FIG. 5, a common rail fuel injector 100e is shown in accordance with an alternative fifth embodiment of the present invention, where like numerals represent like parts to the common rail fuel injector 100a of FIG. 1. Fuel injector 10e includes a valve body 150 having a high-pressure fluid rail 152 extending through the body 150 that communicates with a fluid chamber 154 formed in the injector tip 108 and a control fluid chamber 156 formed in the valve body 150. A needle valve 158 is mounted to extend axially through the valve body 150 and includes a valve tip 160 that normally seats in a valve seat 162 to close fluid orifices 164 formed at the remote end of the injector tip 108.

The needle valve 158 is biased to the closed position by a biasing element, such as by a return spring 166, that acts on a head 168 of the needle valve 158. The needle valve 158 is mounted for reciprocal movement within the valve body 150 for selectively opening and closing the orifices 164 so that fuel may be injected into an engine combustion chamber or cylinder of a combustion engine (not shown).

The high-pressure fluid delivered to the control chamber 156 above the valve 158 and to the fluid chamber 154 in the injector tip 108 creates a force balance along with the return spring 166. The high pressure fluid is retained in the control chamber 156 by a control valve 170 that seals the control chamber 156 from a drain 171. The control valve 170 is biased to a closed position against valve seat 172 by a biasing element, such as by a return spring 174, that acts on a closing head 176 of the control valve 170. The control valve 170 is mounted for reciprocal movement within the valve body 150 for selectively opening and closing a fluid passage from the control chamber 156 to the drain 171.

Further referring to FIG. 5, one end of the control valve 170 remote from the closing head 176 engages at least one bender actuator 122. The control valve 170 engages the bender actuator 122 so that the control valve 170 will travel axially within the valve body 150 upon axial displacement of the bender actuator 122 from the domed, or unactuated configuration shown in FIG. 5 to a flattened, or actuated position (not shown).

In operation of the common rail fuel injector 100e, the return spring 174 biases the control valve 170 to a closed position so that the closing head 176 seats against the valve seat 172 to close the fluid passage from the control chamber 156 to the drain 171. Fuel is delivered under pressure from the high pressure rail 152 to the fluid chamber 154 and to the control chamber 156 to create a force balance along with the return spring 156.

To initiate an injection of fuel from the orifices 164, the ECM (not shown) applies a control signal to the bender actuator 122 that causes the bender actuator 122 to deform or displace axially by flattening out. As the bender actuator 122 flattens out in response to the control signal, the control valve 170, by virtue of its engagement with the bender actuator 122, is pushed off of the valve seat 172 against the force of return spring 174 to open the control chamber 156 to drain 171. This results in a pressure differential being created that lifts the needle valve 158 off of the valve seat 162 against the force of return spring 156 and thereby open the orifices 164 for an injection of fuel.

After the injection cycle is complete, the control signal is either discontinued, or the polarity of the control signal is reversed, to cause the bender actuator 122 to return to its domed configuration as shown in FIG. 5. The return spring 174 assists in returning the control valve 170 to its closed position so that the closing head 176 engages the valve seat 172 to seal the fluid passage from the control chamber 156 to the drain 171. High pressure is restored to the control chamber 156 to create a force balance along with the return spring 156 as described in detail above. This results in the needle valve 158 moving to the closed position against valve seat 162 to close the orifices 164. While not shown, those of ordinary skill in the art will appreciate that multiple bender actuators 122 may be mounted in parallel within the valve body 150 to increase the force applied by the bender actuators 122 to the control valve 170 in response to a control signal applied by the ECM (not shown). Additionally, while not shown, it will be appreciated that the control valve 170 could be rigidly connected to the bender actuator 122 so that the return spring 174 is eliminated. In this embodiment, the bi-directional operation of the bender actuator 122 is used to move the control valve 170 to both its open and closed positions and thereby control operation of the needle valve 158 as described in detail above.

Figure 6:
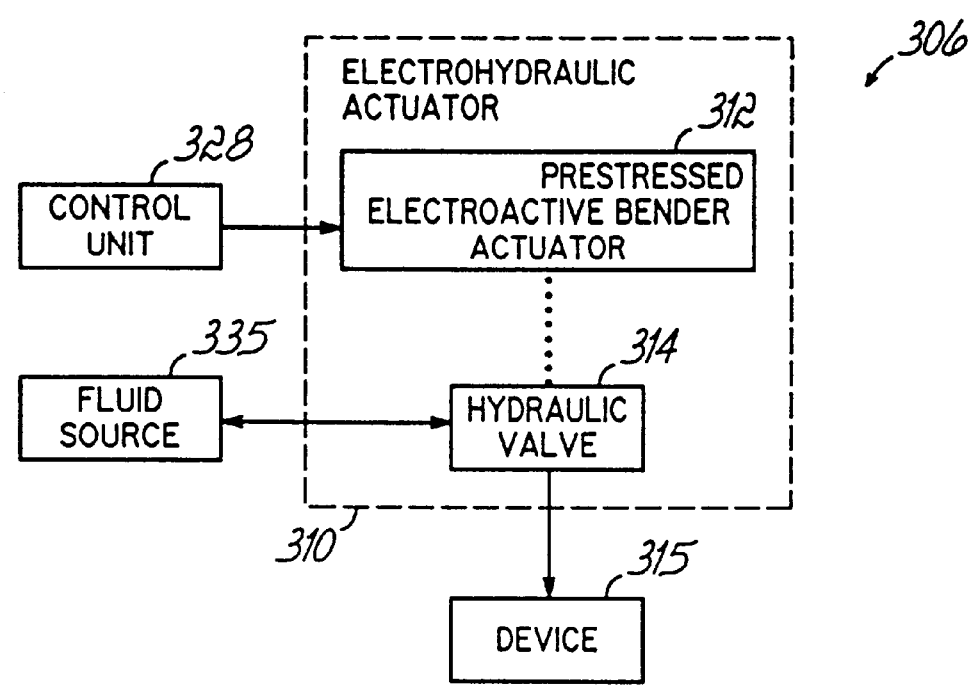
FIG. 6 is a schematic block diagram of an electrohydraulic actuator system in accordance with one embodiment of the present invention.

With reference to FIG. 6, an electrohydraulic actuator 310 comprises a hydraulic valve 314 and an electromechanical actuator 312, such as a prestressed electroactive bender actuator, which may be thermally, mechanically or otherwise pre-stressed, for example. The electrohydraulic actuator 310 receives pressurized hydraulic fluid from a fluid source 335, and the electrohydraulic actuator 310 is fluidly coupled to, and controls the operation of, a device 315 such as a hydraulic valve 314 for example.

In general, to operate the device 315, an electronic control unit 328, such as an electronic control module (ECM) for example, provides a command signal to the bender actuator 312 causing the bender actuator 312 to switch from a first to a second operating state. The hydraulic valve 314 switches from a first to a second operating state as a function of a change in state of the bender actuator 312. The device 315 switches from a first to a second operating state as a function of a change in state of the hydraulic valve 314. The bidirectional capability of the bender actuator 312 is used to switch or return the hydraulic valve 314 and the device 315 from their respective second states to their respective first states.

Figure 7A:
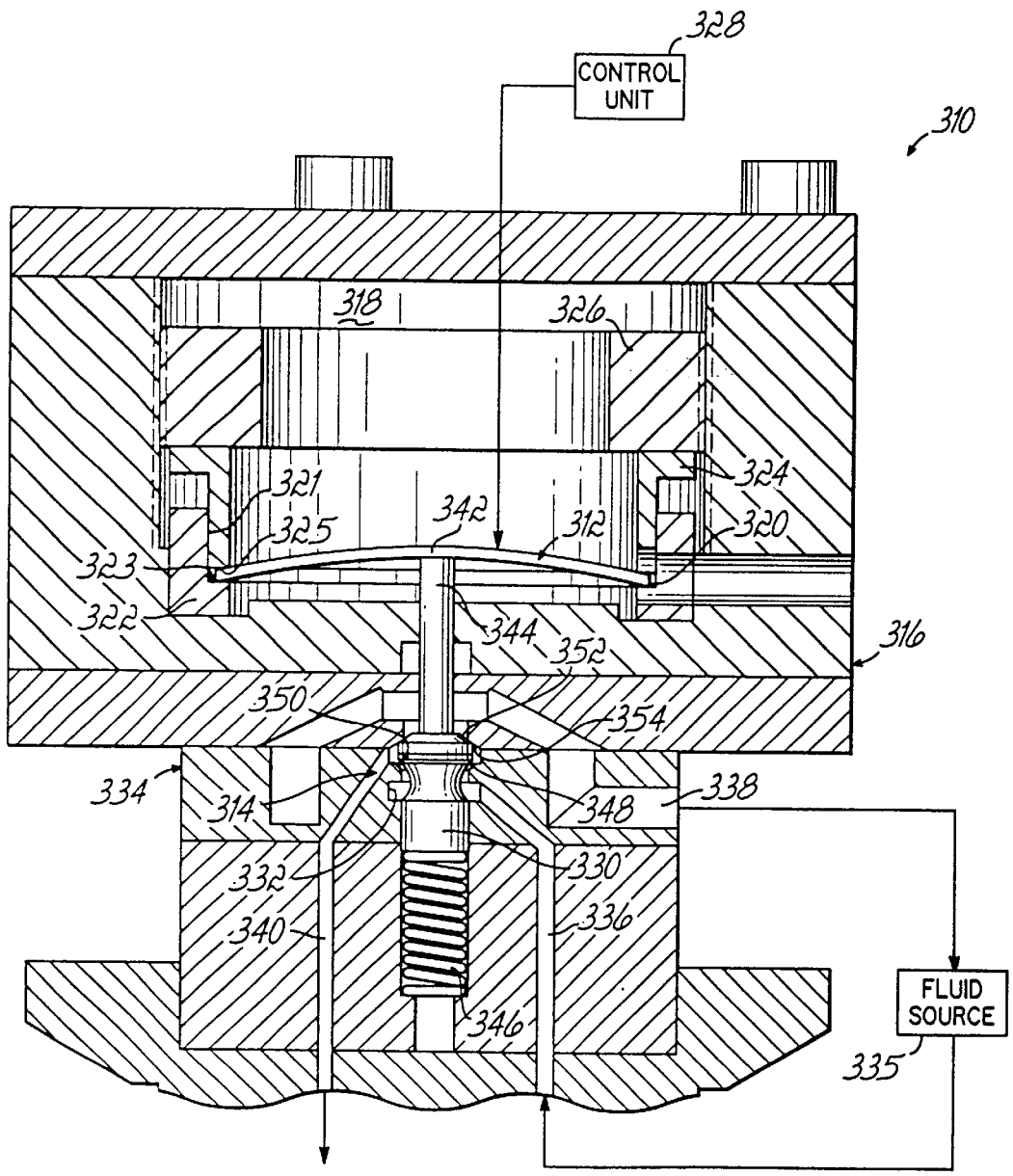
FIGS. 7A and 7B are schematic cross-sectional views illustrating the operation of one embodiment of an electrohydraulic actuator in accordance with the principles of the present invention.
Figure 7B:
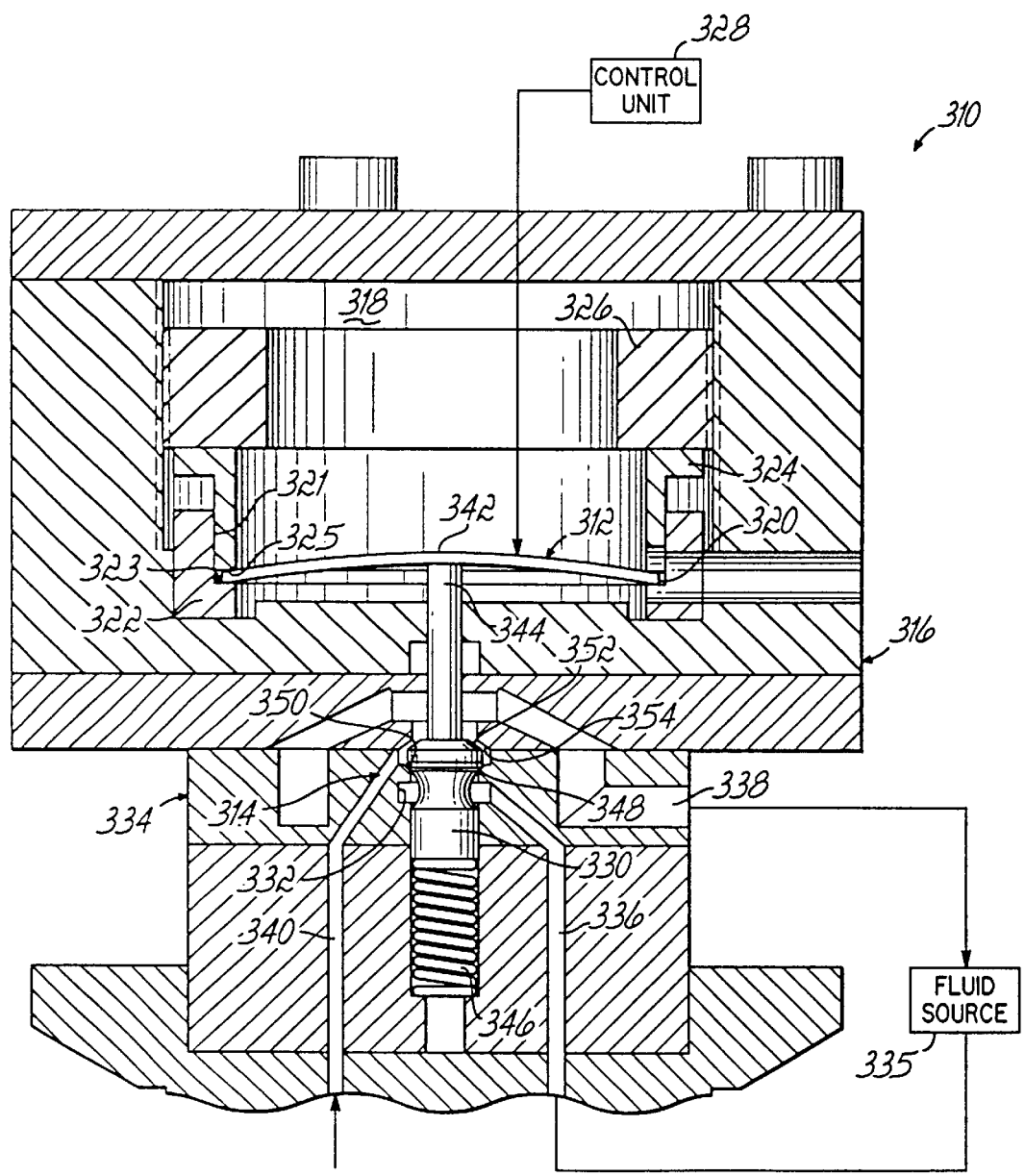
Figure 8:
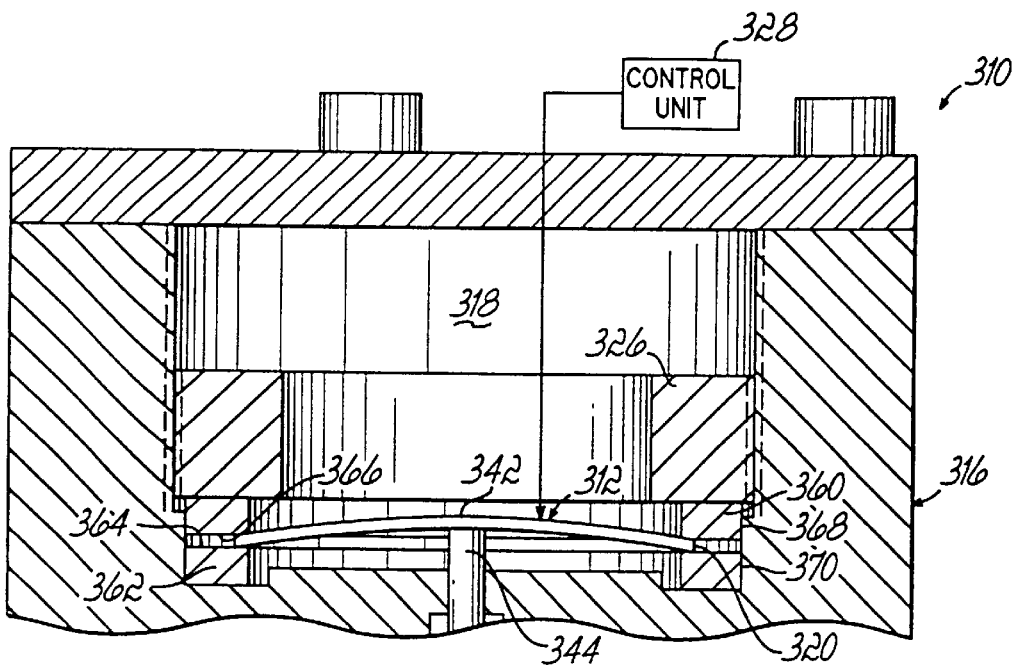
FIG. 8 is a schematic illustration of one embodiment of mounting a pre-stressed electroactive bender actuator used in the electrohydraulic actuator of FIG. 6.

Referring to FIG. 7A, in accordance with the principles of the present invention, the bender actuator 312 comprises a prestressed electroactive bender actuator, which may be thermally, mechanically or otherwise pre-stressed, that changes its shape by deforming in opposite axial directions in response to a control signal applied by the ECM 328. The control signal may be a voltage signal applied from the ECM 328 to the bender actuator 312 though electrical conductors. The bender actuator 312 normally has a circular or disk configuration and includes at least one electroactive layer (not shown) positioned between a pair of electrodes (not shown), although other configurations are possible as well without departing from the spirit and scope of the present invention. In an unactuated or static state, the bender actuator 312 is preferably prestressed to have a domed configuration as shown in FIG. 7A. When the electrodes are energized to place the bender actuator 312 in an actuated state, the bender actuator 312 displaces axially to a less domed configuration as shown in FIG. 7B. The bender actuator 312 may be a model TH-5C commercially available from Face International, Inc. of Norfolk, Va. Other appropriate actuators may also be used. One or more bender actuators 312 may comprise a plurality of bender actuators (configured in parallel or in series) that are individually stacked or bonded together into a single multi-layered element.

The bender actuator 312 is disposed within a cavity 318 within the housing 316 and is supported at its peripheral edge 320 between lower and upper clamp rings 322, 324 respectively. The clamp rings are normally made from a stiff electrically nonconductive material. The lower clamp ring 322 is generally L-shaped in cross section and has a generally cylindrical inner side surface 321 that locates the peripheral edge 320 of the bender actuator 312. The lower clamp ring 322 has an annular support surface 323 that supports one side of the bender actuator 312 around its peripheral edge 320. The upper clamp ring 324 is also generally L-shaped in cross section and has a bearing surface 325 that contacts an opposite side of the bender actuator 312 around its peripheral edge 320.

A load ring 326 threadably engaged within the housing is used to prestress the bender actuator 312 with a clamping force. As the load ring 326 is tighten and loosened, the clamping force is respectively increased and decreased on the peripheral edge 320 of the bender actuator 312 via the upper clamp ring 324. Increasing the clamping force on the bender actuator 312 reduces an axial displacement of the bender actuator 312 in response to a given control signal magnitude. Conversely, decreasing the clamping force results in a greater axial displacement. In the embodiment of FIG. 7A, the load ring 326 applies a clamping force around the whole peripheral edge 320 of the bender actuator 312. As will be appreciated, in an alternative embodiment, the bearing surface of the upper clamp ring 324 may be notched or cut out at different locations around its circumference. Thus, no clamping force is directly applied to the portions of the peripheral edge 320 of the bender actuator 312 that are directly opposite the cutouts in the bearing surface of the upper clamp ring 324. Alternatively, a static load may be applied to the bender actuator 312 when the electrohydraulic actuator 310 is bolted together so that the load ring 326 is not threadably engaged to the housing 316 according to this embodiment.

The hydraulic valve 314 is comprised of a movable valve element 330, such as, a poppet for example, disposed in a cavity 332 of a valve body 334 on which the housing 316 is mounted. The hydraulic valve 314 of FIG. 2A is a three-way two-position valve. As will be appreciated, other comparably functioning valves may be used in place of the poppet 330. Hydraulic fluid is provided from a source of pressurized fluid 335 via a supply passage 336 that intersects the cavity 332. Hydraulic fluid is returned to the fluid source 335 via drain passages 338 that also intersects the cavity 332. Operation of the hydraulic valve 314 connects either the supply passage 336 or the drain passage 338 to a control passage 340. As will be appreciated, the two-dimensional depiction of the passages 336, 338, 340 in FIG. 2A is schematic in nature. Often the hydraulic valve 314 is manufactured such that the passages 336, 338 and 340 intersect the cavity 332 at different circumferential locations of the cavity 332.

In FIG. 7A, the bender actuator 312 is illustrated in its domed, unactuated, quiescent position, that is, its prestressed mechanical state; and the poppet 330 is shown in its first position. The bender actuator 312 operates in response to the ECM 328 supplying command signals in the form of biasing voltages of different polarities and magnitudes. The unactuated state of the bender actuator 312 is achieved in response to the ECM 328 providing a first command signal to the bender actuator 312, such as, a DC biasing voltage of a first polarity. When in that state, a center portion 342 of the bender actuator 312 is displaced vertically upward to a flexed or domed position. An actuating pin or portion 344 of the poppet 330 is mechanically biased against a lower side of the center portion 342 of the bender actuator 312 by a biasing element, such as, a return spring 346 for example.

The actuating pin 344 is normally made from an electrically nonconducting material, such as, zirconia for example. As will be appreciated, the actuating pin may be fabricated of other electrically insulating materials known to those skilled in the art. Alternatively, the end of the actuating pin 344 that is in contact with the bender actuator 312 may be constructed to have an electrically nonconductive tip.

In the first position, the poppet 330 has a first annular sealing area 348 that is separated from an annular lower seat 350 on the valve body 334.

Therefore, pressurized hydraulic fluid is released to flow from the supply passage 336 to the control passage 340. When in the first position, the poppet 330 has a second annular sealing area 352 that is engaged with an annular upper seat 354, thereby blocking the flow of hydraulic fluid from the control passage 340 to the drain passage 338.

When it is desired to operate or change the state of the hydraulic valve 314, the ECM 328 provides a second command signal to the bender actuator 312, such as, a first DC biasing voltage of a different polarity from the first command signal. The second command signal causes the bender actuator 312 to flex in a generally vertically downward direction to a less domed or slightly domed position. The downward motion of the bender actuator 312 overcomes the biasing force of the return spring 346 as the bender actuator 312 moves to its actuated, second position as illustrated in FIG. 7B. It should be noted that if the first command signal is removed, the bender actuator 312 will temporarily remain in the position illustrated in FIG. 7B until its charge sufficiently leaks off. Therefore, substantially less power is required to maintain the bender actuator 312 than other actuators, such as, a solenoid for example.

Motion of the bender actuator 312 downward pushes the actuator portion 342 and the poppet 330 downward to its second position. With the poppet 330 at its second position, the second annular sealing area 352 is separated from the annular upper seat 354, thereby opening the control passage 340 to the drain passage 338. Further, the first annular sealing area 348 engages the annular lower seat 350 on the valve body 334, and pressurized hydraulic fluid from the supply passage 336 is blocked from the control passage 340.

The hydraulic valve 314 remains in the state illustrated in FIG. 7B until the ECM 328 provides a different or the first command signal. When the ECM 328 again applies the first command signal to the bender actuator 312, the bender actuator 312 moves generally upward until it achieves the unactuated, domed first position illustrated in FIG. 7A. It should be noted that if the first command signal is removed, the bender actuator 312 will temporarily remain in the position illustrated in FIG. 7A until its charge sufficiently leaks off. As the bender actuator 312 moves upward, the return spring 346 biases the poppet 330 upward against the center portion 342 of the bender actuator 312. As the poppet moves upward, the second annular sealing area 352 engages against the annular upper seat 354, thereby again closing the control passage 340 from the drain passage 338. Further, the first annular sealing area 348 separates from the annular lower seat 350 on the valve body 334, thereby initiating flow of pressurized hydraulic fluid to the control passage 340.

The operation of the return spring 346 moves the poppet 330 with a relatively high force, and the poppet 330 impacts the upper valve seat 354 at a relatively high velocity. Such repeated high velocity impact of the poppet 330 against the seat 348 causes wear and reduces the useful lives of the poppet 330 and seat 348. The bender actuator 312 is a proportional and bidirectional actuator, and those features can be used to cushion or reduce the impact of the poppet 330 on the seat 354. After the first command signal is provided to the bender actuator 312 to move it back toward its first position as illustrated in FIG. 7A, the poppet 330 is moved towards its seat by the return spring 346.

As the poppet 330 moves toward the upper seat 354, the ECM 328 applies to the bender actuator 312 a third command signal or bias similar to, but less than, the first command signal. The third command signal causes the bender actuator 312 to move through a small upward displacement to a slightly domed third position. That third position increases the resistance force against the operation of the return spring 346. With the resistance force, the velocity of the poppet 330 is reduced as is the impact force of the poppet 330 on the seat 354. As will be appreciated, the ECM 328 can provide command signals to bender actuator 312 that control both the displacement or position, velocity and acceleration of the bender actuator 312 in order to more precisely control the operation of the poppet 330.

In the described embodiment with respect to FIG. 6, the clamp rings 322, 324 are illustrated as generally L-shaped members in cross section in which the lower clamp ring 322 has a side surface 321 for locating the peripheral edge 320 of the bender actuator 312. As will be appreciated, other configurations of clamp rings may be used. For example, referring to FIG. 8, upper and lower clamp rings 360, 362 are disposed within the cavity 318 of the housing 316. The lower clamp ring 362 has an annular support surface 364 for supporting a lower side of the bender actuator 312 about the peripheral edge 320. The upper clamp ring 360 has an annular bearing surface 366 for applying a clamping force around the peripheral edge 320 on an opposite side of the bender actuator 312. The outer circumferential surfaces 368, 370 of the upper and lower rings 360, 362 locate the rings inside the cavity 318. The load ring 326 functions as previously described with respect to FIG. 6 to apply a clamping force to the peripheral edge 320 of the bender actuator 312. As previously discussed, the bearing surface 366 of the upper clamp ring 360 may be cut out at different locations to vary the application of the clamping force against the bender actuator 312.

The clamp rings 322, 324, 360, 362 are normally made of a stiff, electrically nonconductive material. As will be appreciated, the rings may be made of a conductive material if the surfaces of the bender actuator 312 contacting the rings is protected with a dielectric coating. Alternatively, one of the above embodiments may be used with each ring. As a further alternative, a compliant material such as rubber or a "VITON" material may be used between the clamp rings and the bender actuator in order to improve the actuator loading.

Figure 9:
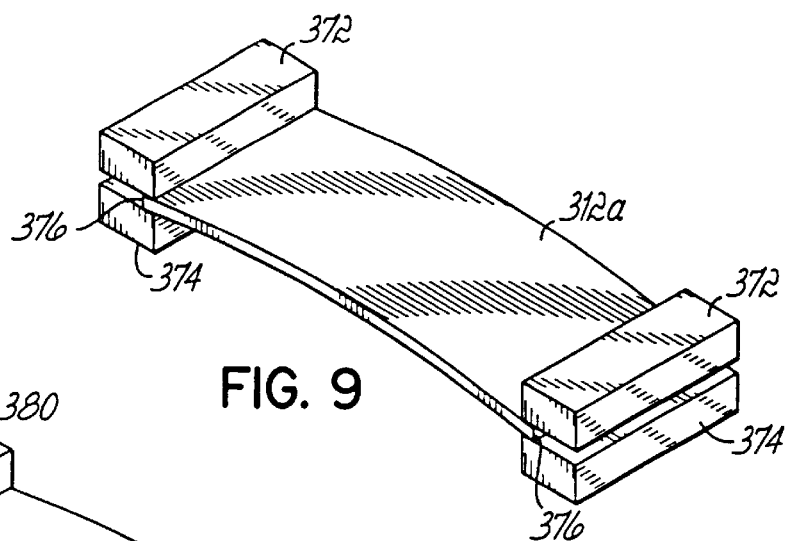
FIG. 9 is a schematic illustration of a first embodiment of a pre-stressed electroactive bender actuator used in the electrohydraulic actuator of FIG. 6.

In the described embodiment, the bender actuator 312 is circular in nature. Referring to FIG. 9, the bender actuator 312a may be quadrilateral, for example, square or rectangular. Upper and lower clamping members 372, 374, respectively, extend along sides 376 of the bender actuator 312a that are parallel to its axis of curvature. The clamping members 372, 374 secure the sides 376 of the bender actuator 312a in a similar manner as described with respect to FIGS. 1 and 2. Further, the clamping members 372, 374 may be of different configurations similar to the clamp rings 322, 324 described earlier. As will be appreciated, the bender actuator 312a may be of any shape or size that permits it to execute the functions described herein.

Figure 10:
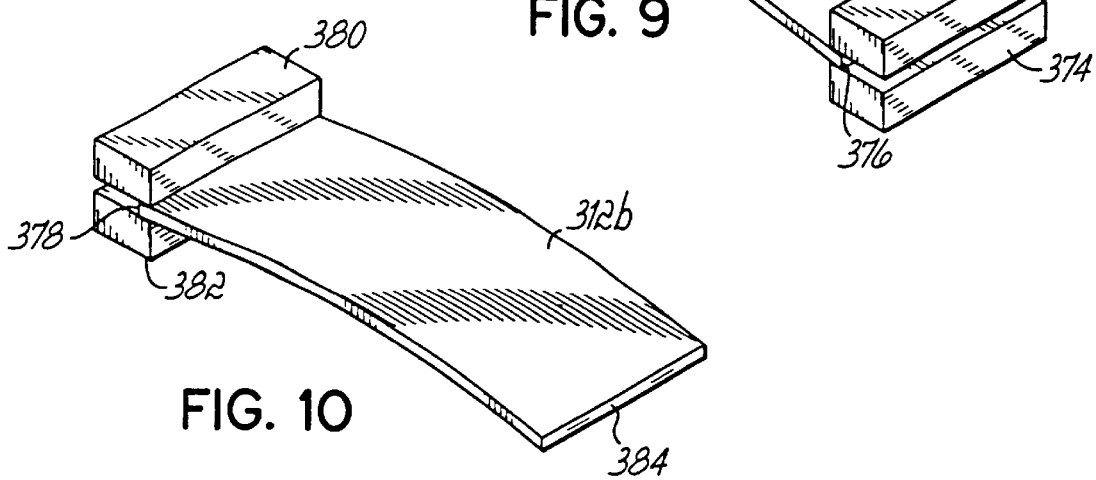
FIG. 10 is a schematic illustration of a second embodiment of a pre-stressed electroactive bender actuator used in the electrohydraulic actuator of FIG. 6.
Figure 11:
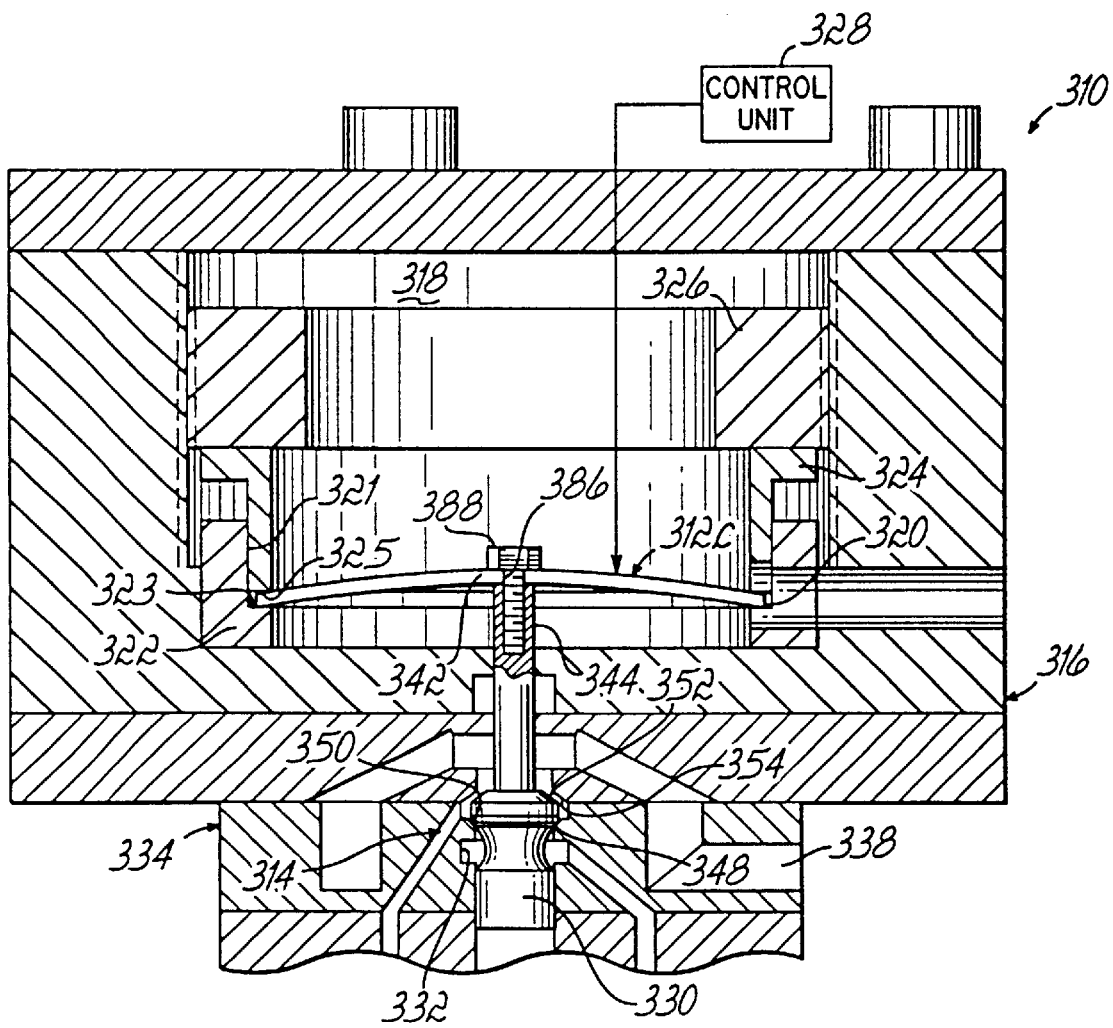
FIG. 11 is a schematic illustration of a third embodiment of a pre-stressed electroactive bender actuator used in the electrohydraulic actuator of FIG. 6.

Referring to FIG. 10, a bender actuator 312b may be supported along only a single side 378 between upper and lower clamping members 380, 382, respectively. In this embodiment, the distal end 384 of the bender actuator 312b experiences a linear displacement in response to biasing voltages of opposite polarities.

In the described embodiment, the electromechanical bender actuator 312 is applied to a hydraulic valve 314 that is described as a 2-position 3-way poppet valve. The concept of the present invention can be extended to an N-position M-way poppet valve. Further, the present invention can be used with a spool valve or any other linearly translatable valve.

In the described embodiment, the poppet 330 is held in contact with the bender actuator 312 by a return spring 346. While return springs are widely used in combination with valves, in this application, a return spring represents a significant force to be opposed by the bender actuator 312. Further, the variability of the spring constant of the return spring 346 can have a significant effect on the performance of fast proportional valves. As an alternative to the use of a return spring, referring to FIG. 11, a hole 386 is formed at the center of the bender actuator 312c. A fastener 388, such as, a screw for example, is threadably engaged with the end of the actuating pin 344. Thus, with the bender actuator 312c rigidly connected to the actuating pin 344, the bender actuator 312c is now capable of moving the actuating pin 344 and poppet 330 bidirectionally with the bidirectional operation of the bender actuator 312c. Therefore, the need for a return spring is eliminated. As will be appreciated, instead of using a fastener 388, the end of the actuating pin 344 may be rigidly connected to the bender actuator 312c by adhesives, bonding or attaching by other means.

Figure 12:
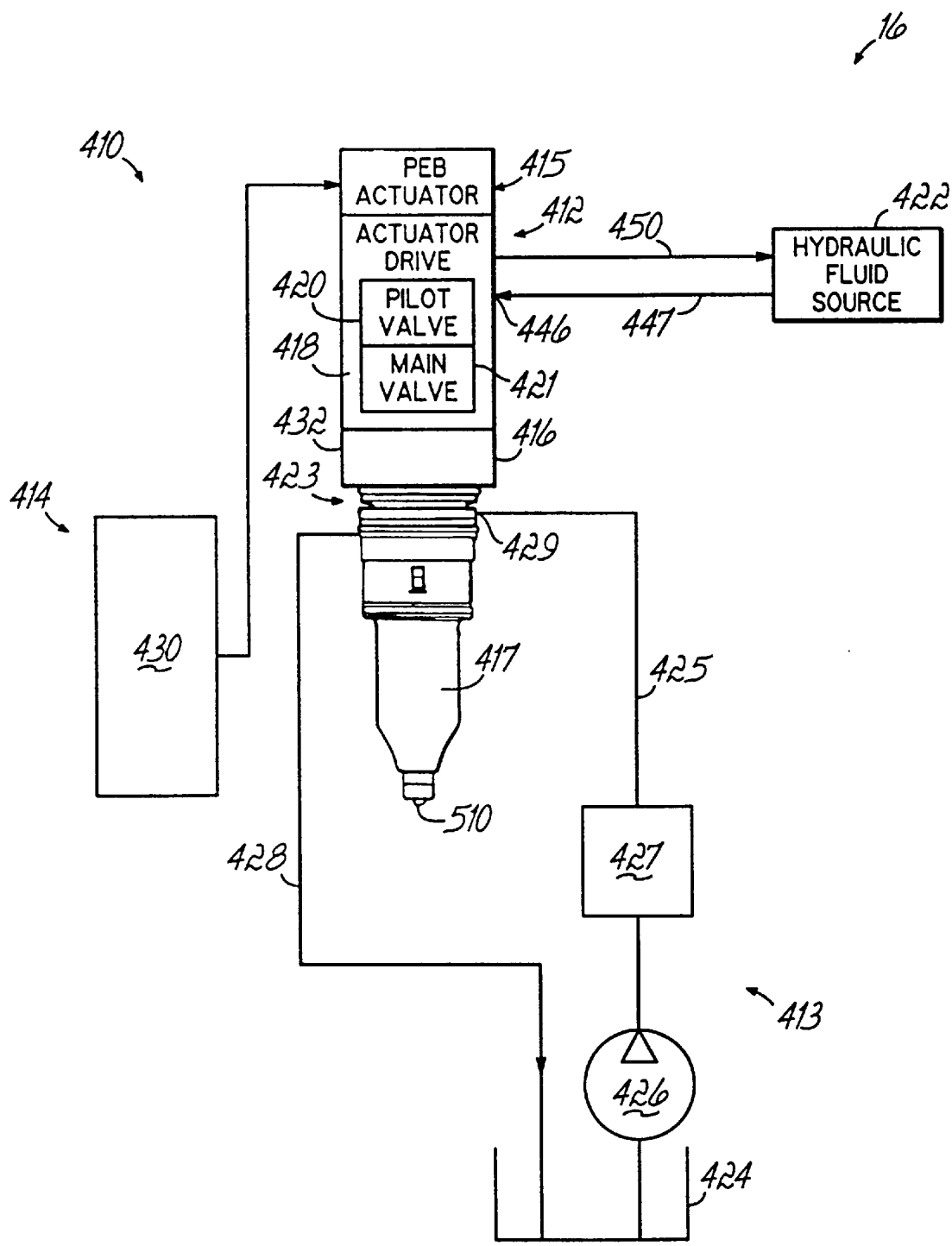
FIG. 12 is a diagrammatic view of an electronically-controlled fuel injector system in accordance with the principles of the present invention.

With reference to the Figures, and to FIG. 12 in particular, an exemplary embodiment of an electronically-controlled fuel system 410 for employing the present invention is shown. The exemplary fuel injection system 410 is adapted for a direct-injection diesel-cycle reciprocating internal combustion engine. However, it should be understood that the present invention is also applicable to other types of engines, such as rotary engines, or modified-cycle engines, and that the engine may contain one or more engine combustion chambers or cylinders. The fuel system 410 includes a fuel injector 412, apparatus 413 for supplying fuel to each injector 412, and apparatus 414 for electronically controlling each injector 412.

The engine has at least one cylinder (not shown) wherein each cylinder intersects one or more separate injector bores (not shown), each of which receives a fuel injector 412 in accordance with the principles of the present invention. The fuel injector 412 should pressurize a supply of fuel from the fuel supply 413, atomize the pressurized fuel by pumping it through one or more output orifices 510, deliver the correct amount of pressurized fluid to the combustion chamber portion of the cylinder and evenly disperse the fuel throughout the combustion chamber. Each injector is comprised of an electrohydraulic injector drive 415 and an injector actuator 423. The injector drive 415 is comprised of an actuator drive 418 and an electromechanical actuator 419, such as a prestressed electroactive bender actuator, which may be thermally, mechanically or otherwise prestressed, for example. The actuator drive 418 is fluidly coupled to a source of or drain for pressurized fluid 422, such as a hydraulic oil for example, and comprises a main valve 421 and a hydraulic pilot valve 420 responsive to the operation of the bender actuator 419. The injector actuator 423 is comprised of a pressure intensifier 416 and an injection valve system 417.

In general, to operate the injection valve system 417, the electronic control 414 provides a command signal to the bender actuator 419 causing the bender actuator 419 to move through a displacement and switch from a first to a second operating state. The actuator drive 418 switches from a first to a second operating state as a function of a change in state of the bender actuator 419. More specifically, as the bender actuator 419 moves through its displacement, it also moves the pilot valve 420. Movement of the pilot valve 420 redirects pressurized hydraulic fluid and changes the state of the main valve 421. Further, the redirected hydraulic fluid cause the pressure intensifier 416 and the injection valve system 417 to switch from first to second operating states as a function of the change in state of the actuator drive 418, thereby either initiating a supply of, or terminating a supply of, pressurized fuel from the output orifice 510 of the fuel injector 412.

The fuel supplying apparatus 413 typically includes a fuel tank 424, a fuel supply passage 425 fluidly coupled between the fuel tank 424 and an inlet port 429 of the fuel injector 412, a relatively low pressure fuel transfer pump 426, one or more fuel filters 427, and a fuel drain passage 428 fluidly coupled between the injector 412 and the fuel tank 424. If desired, fuel passages may be disposed in the head of the engine that are fluidly coupled with the fuel injector 412 and one or both of the passages 425, 428.

The electronic control apparatus 414 preferably includes an electronic control module (ECM) 430 which controls at least: (1) fuel injection timing and pressure; (2) total fuel injection quantity during an injection cycle; (3) the phases during each segment of each injection cycle; (4) the number of separate injection segments during each injection cycle; (5) the time interval(s) between the injection segments; and (6) the fuel quantity delivered during each injection segment of each injection cycle.

Normally, each injector 412 is a unit injector wherein the injector drive 415, pressure intensifier 416 and injection valve system 417 are disposed in a common housing 432. Although shown as a unitized injector 412, the injector 412 could alternatively be of a modular construction wherein the pressure intensifier 416 is separate from the injection valve system 417. As a further alternative, the injector drive 415 may be separated from the pressure intensifier 416.

Figure 13A:
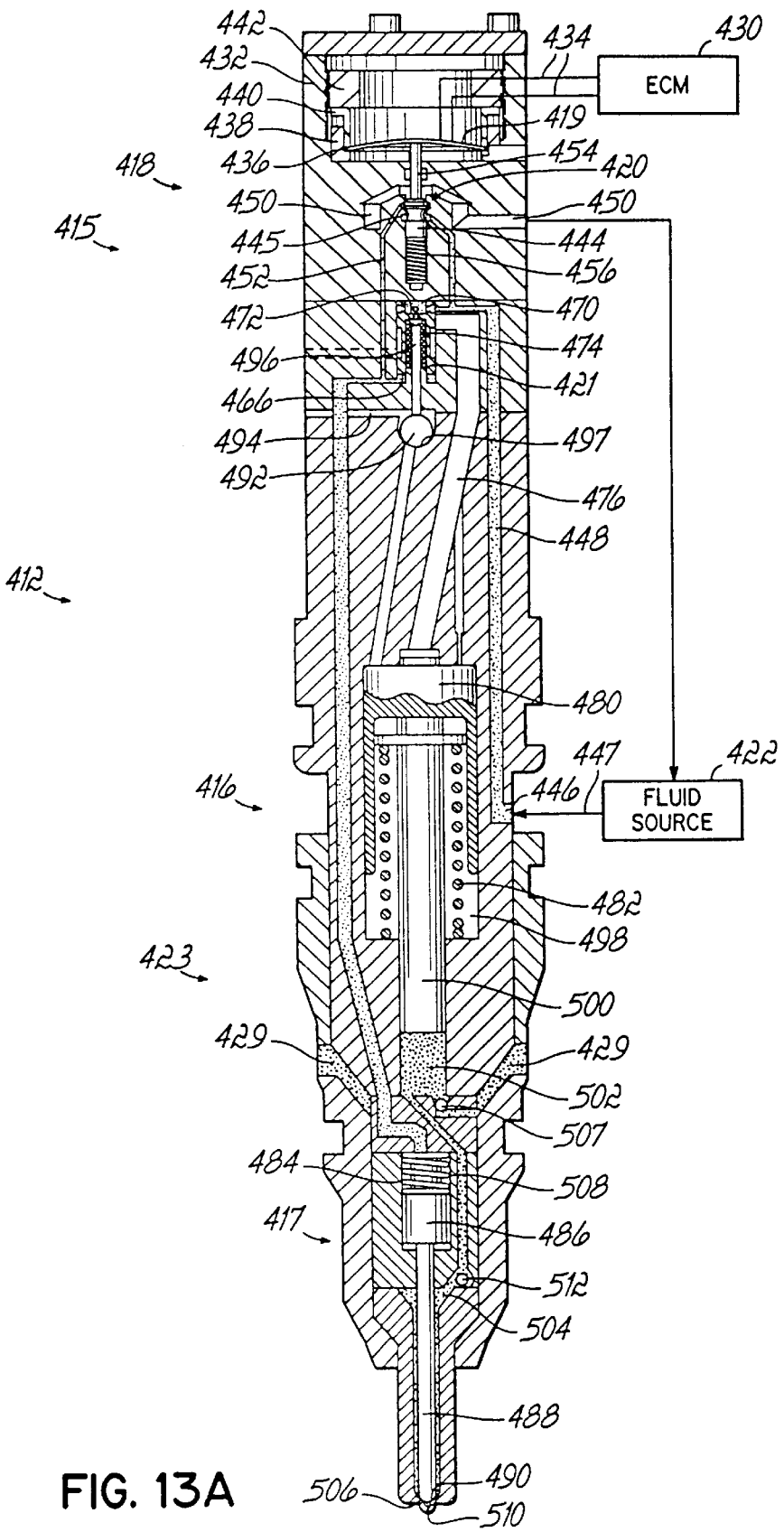
FIGS. 13A and 13B are cross-sectional views of the fuel injector used in the system of FIG. 12 illustrating the states of components within the fuel injector during a preinjection phase of a fuel injection cycle.

Referring to FIG. 13A, in accordance with the principles of the present invention, the bender actuator 419 comprises a prestressed electroactive bender actuator, which may be thermally, mechanically or otherwise prestressed, that changes its shape by deforming in opposite axial directions in response to a control signal applied by the ECM 430. The control sign al may be a voltage signal applied from the ECM 430 to the bender actuator 419 through a pair of electrical conductors 434. The bender actuator 419 normally has a circular or disk configuration and includes at least one electroactive layer (not shown) positioned between a pair of electrodes (not shown), although other configurations are possible as well without departing from the spirit and scope of the present invention. In an unactuated or static state, the bender actuator 419 is preferably prestressed to have a domed configuration as shown in FIG. 13A. When the electrodes are energized to place the bender actuator 419 in an actuated state, the bender actuator 419 displaces axially to a less domed configuration as shown in FIG. 13B.

The bender actuator 419 may be a model TH-5C commercially available from Face International, Inc. of Norfolk, Va. Other appropriate actuators may also be used. One or more bender actuators 419 may comprise a plurality of bender actuators (configured in parallel or in series) that are individually stacked or bonded together into a single multi-layered element.

Figure 13B:
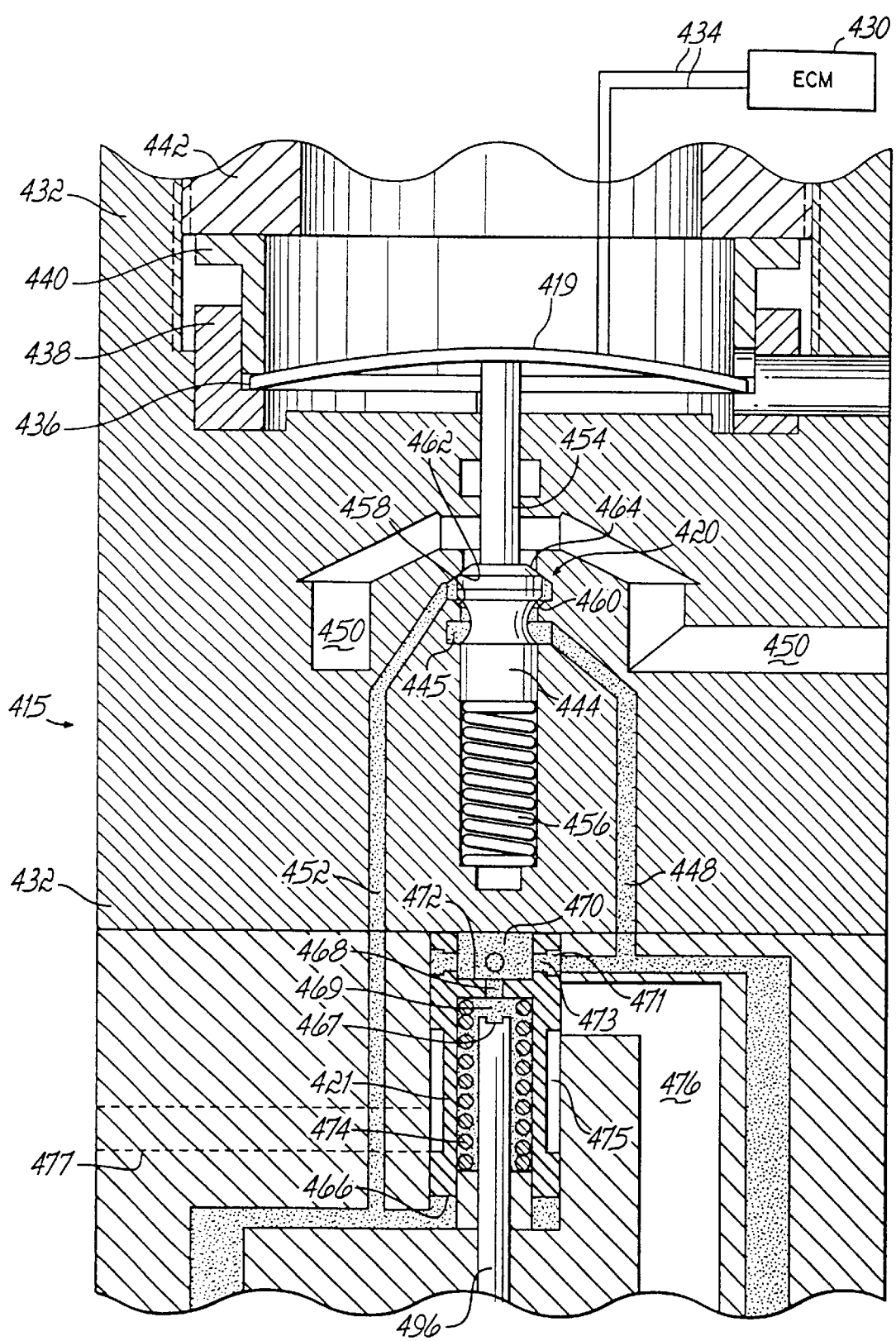

Referring to FIGS. 13A and 13B, the bender actuator 419 is disposed within the housing 432 and is supported at its peripheral edge 436 between lower and upper clamp rings 438, 440, respectively. The clamp rings are normally made from a stiff electrically nonconductive material. The lower clamp ring 438 is generally L-shaped in cross section and has an annular support surface for supporting a lower side of the bender actuator 419 around its peripheral edge 436. The upper clamp ring 440 is also generally L-shaped in cross section and has a bearing surface that contacts an upper side of the bender actuator 419 around its peripheral edge 436. As will be appreciated, other configurations of the clamp rings 438, 440 may be used.

A load ring 442, threadably engaged within the housing 432, is used to prestress the bender actuator 419 with a clamping force. As the load ring 442 is tighten and loosened, the clamping force is respectively increased and decreased on the peripheral edge 436 of the bender actuator 419 via the upper clamp ring 440. Increasing the clamping force on the bender actuator 419 reduces an axial displacement of the bender actuator 419 in response to a given control signal magnitude. Conversely, decreasing the clamping force results in a greater axial displacement. In the embodiment of FIG. 2A, the load ring applies a clamping force around the whole peripheral edge 436 of the bender actuator 419. As will be appreciated, in an alternative embodiment, the bearing surface of the upper clamp ring 440 may be notched or cut out at different locations around its circumference. Thus, no clamping force is directly applied to the portions of the peripheral edge 436 of the bender actuator 419 that are directly opposite the cutouts in the bearing surface of the upper clamp ring 440. It will be appreciated by those of ordinary skill in the art that other clamping configurations are possible as well, as described in detail above, without departing from the spirit and scope of the present invention.

The hydraulic pilot valve 420 is comprised of a movable valve 444, such as a poppet for example, that is disposed in a cavity 445 in the housing 432. The pilot valve 420 of FIGS. 2A and 2B is a three-way two-position valve. As will be appreciated, other comparable functioning valves may be used in place of the poppet 444. The injector housing 432 has an inlet port 446 fluidly coupled with the supply line 447 of the hydraulic fluid source 422. Pressurized hydraulic fluid from the fluid source 422 passes through a supply passage 448 that intersects cavity 445 of the housing 432. Hydraulic fluid is returned to the fluid source 422 via drain passages 450 that also intersect the cavity 445. Operation of the pilot valve 420 connects either the supply passage 448 or the drain passage 450 to a control passage 452. As will be appreciated, the two-dimensional depiction of the passages 448, 450, 452 in FIG. 2A are schematic in nature. Often the pilot valve 420 is manufactured such that the passages 448, 450, 452 intersect the cavity 445 at different circumferential locations of the cavity 445.

In FIGS. 13A and 13B, the bender actuator 419 is illustrated in its domed, quiescent, unactuated state or position. When in the unactuated state, a center portion of the bender actuator 419 is displaced vertically upward to a flexed or domed position. An actuating pin or portion 454 of the poppet valve 444 is mechanically biased against a lower side of the center portion of the bender actuator 419 by a biasing element, such as a return spring 456 for example.

The actuating pin 454 is normally made from an electrically nonconducting material, such as zirconia for example. As will be appreciated, the actuating pin may be fabricated of other electrically insulating materials known to those who are skilled in the art. Alternatively, the end of the actuating pin 454 that is in contact with the bender actuator 419 may be constructed to have an electrically nonconductive tip.

In the position illustrated in FIGS. 13A and 13B, the poppet valve 444 has a first annular sealing area 458 that is separated from an annular lower seat 460 on the housing 432. Therefore, pressurized hydraulic fluid is free to flow from the supply passage 448 to the control passage 452. Further, the poppet 444 has a second annular sealing area 462 that is engaged with an annular upper seat 464, thereby blocking the flow of hydraulic fluid from the control passage 452 to the drain passage 450.

With the poppet 444 in the position illustrated in FIGS. 13A and 13B, the pressurized hydraulic fluid is provided to a bottom 466 of the main valve 421, such as a spool valve for example. The supply passage 448 also intersects an external annular passage or annulus 471 on the spool valve 421.

Holes 473 provide a fluid connection between the annulus 471 and a fluid cavity 470. Thus, the supply passage 448 provides pressurized fluid to the cavity 470 that is contiguous with an upper end or top 472 of the spool valve 421. The spool valve is designed such that when the pressurized hydraulic fluid is applied to ends, the forces applied by the pressurized hydraulic fluid are equal and opposite.

With equal fluid forces, the spool valve 421 is biased toward a closed position illustrated in FIG. 13A by a biasing element 474, such as a return spring for example.

With the spool valve 421 closed, the fluid passage 476 is fluidly connected to an annular fluid path or annulus 475 that in turn intersects a drain line 477. Thus, any fluid pressure in the fluid path 476 is relieved when the spool valve 421 is in its upper, closed position. Further, with the spool valve 421 in its closed position, hydraulic fluid in the supply passage 448 is blocked from entering the top of the hydraulic fluid passage 476 that is connected to a cavity 498 containing an intensifier piston 480. With no hydraulic fluid force being applied to the top of the pressure intensifier 416, a biasing element 482, such as a return spring for example, holds the intensifier piston 480 at its uppermost position within the cavity 498.

With the poppet valve 420 in the position shown in FIGS. 13A and 13B, pressurized hydraulic fluid in control passage 452 is directed to a cavity 484 above a check piston 486 connected to a nozzle check valve 488. Pressurized hydraulic fluid above the check piston 486 forces the check piston 486 and nozzle valve 488 downward. An end 506 of the nozzle check valve 488 is sealingly engaged against an interior surface of the tip 490 of the fuel injector 412, thereby closing the nozzle check valve 488 and prohibiting the flow of fuel from its output orifice 510.

The fuel injector 412 operates with a split injection cycle that has the following five phases of injection: preinjection, pilot injection, injection delay, main injection and fill. The preinjection phase exists when the engine is running and the injector 412 is between firing cycles. The preinjection phase is illustrated by the states of the various components of the fuel injector 412 illustrated in FIGS. 13A and 13B. Hydraulic fluid pressure on the spool valve 421 is balanced; and therefore, the spool valve 421 is held closed by the return spring 474, thereby stopping a flow of pressurized hydraulic fluid to the intensifier piston 480.

In its raised, closed position, the spool valve 421 separates from, and mechanically releases, spool pin 496 and ball check valve 492. Therefore, the pressure of any hydraulic fluid in fluid passage 476 is released around ball check valve 492 and out vent line 494. Thus, the pressure intensifier 416 is maintained inactive; and pressurized hydraulic fluid in the control passage 452 holds the check piston 486 and nozzle check valve 488 closed. Therefore, fuel received at the inlet port 429 is not injected into a cylinder.

Figure 14A:
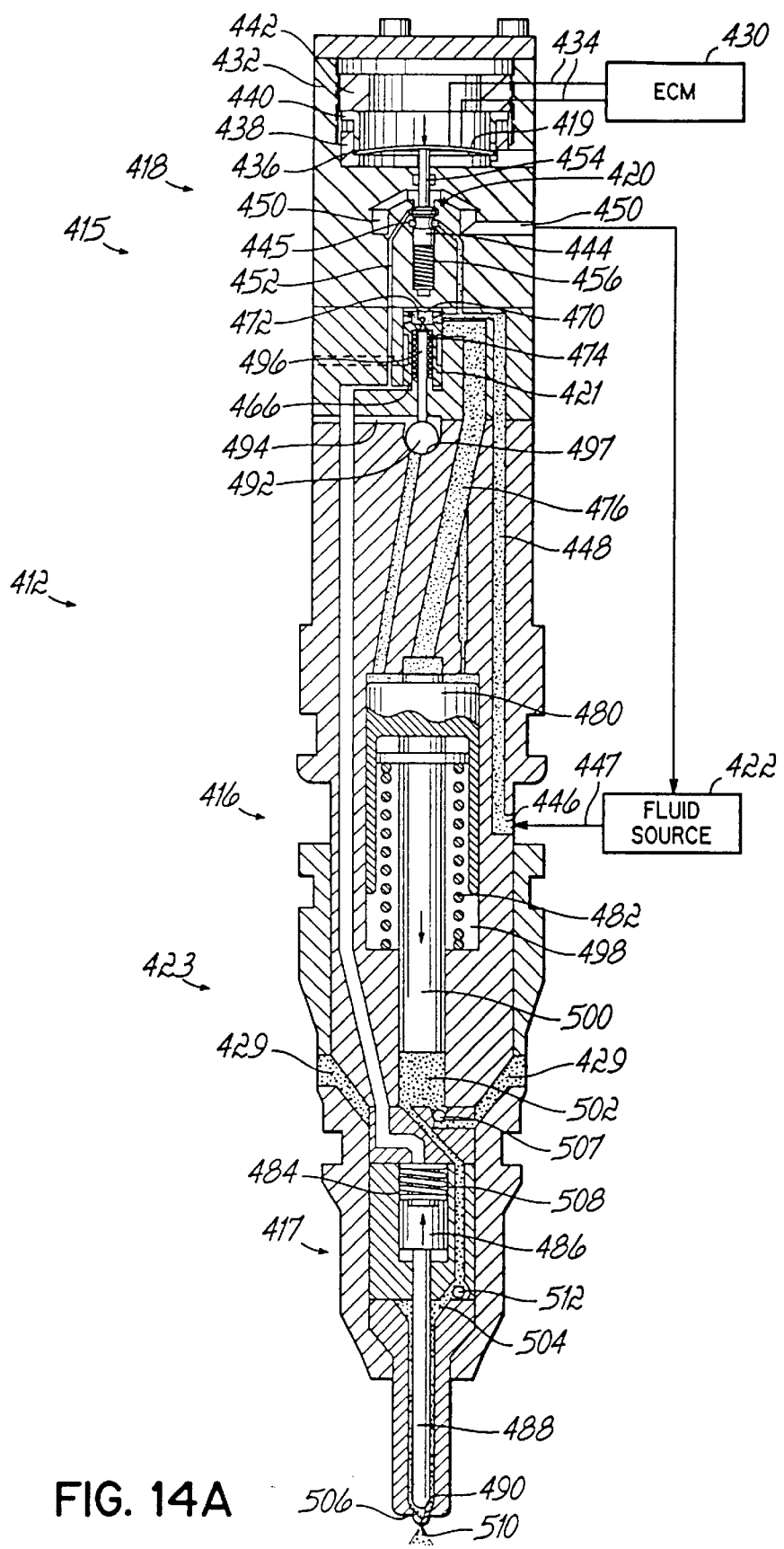
FIGS. 14A ad 14B are cross-sectional views of the fuel injector used in the system of FIG. 12 illustrating the states of components within the fuel injector during a pilot injection phase of a fuel injection cycle.
Figure 14B:
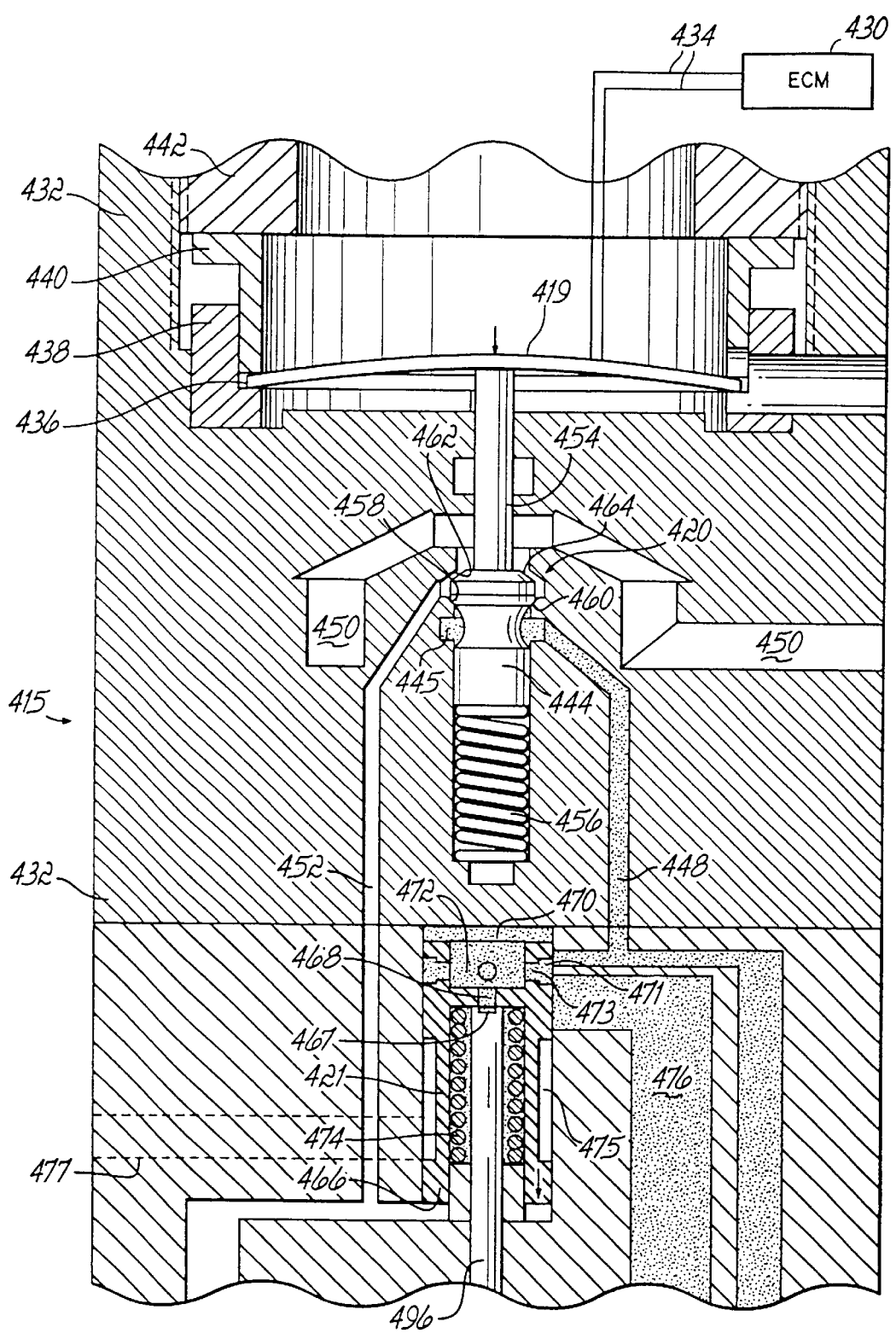

At the appropriate time, the ECM 430 initiates the pilot injection phase by providing a first command signal to the bender actuator 419, such as a DC biasing voltage of a first polarity. Referring to FIGS. 14A and 14B, the first command signal causes the bender actuator 419 to flex in a first direction, such as a generally vertically downward direction as viewed in FIG. 13A to a less domed or slightly domed, actuated, first position. It should be noted that with actuators currently available, such actuators never reach a flat state; and they will be destroyed by any flexure past center or a flat state.

The downward movement of the bender actuator 419 overcomes the biasing force of the return spring 456 as the bender actuator 419 moves to its actuated, first position. It should be noted that if the first command signal is removed, the bender actuator 419 will temporarily remain in the position illustrated in FIGS. 14A and 14B until its charge sufficiently leaks off. Therefore, substantially less power is applied to maintain the bender actuator 419 and other actuators, such as a solenoid for example.

Movement of the bender actuator 419 downward pushes the actuator pin 452 and poppet 420 downward to a first position. With the poppet valve 420 at its first position, the first annular sealing area 458 engages the annular lower seat 460, and the pressurized hydraulic fluid from the supply passage 448 is blocked from the control passage 452. Further, the second annular sealing area 462 is separated from the annular upper seat 464, thereby opening the control passage 452 to the drain passage 450. Thus, hydraulic pressure is removed from the bottom side 466 of the spool valve 421.

The pressure head in the cavity 470 at the top 472 of the spool valve 421 overcomes the force exerted by the return spring 474, and the spool valve 421 moves vertically downward to an open position. As the spool valve 421 moves downward, it contacts the top of the spool pin 496; and the spool valve 421 and spool pin 496 mechanically secure the ball check valve 492 in its seat area 497, thereby sealing the fluid passage 476 from the vent line 494.

A displacement of the spool valve 421 to its lower, open position terminates the fluid connection between the fluid path 476 and the annulus 475 and drain line 477. Further, displacement of the spool valve 421 downward opens a fluid path via annulus 471 between the supply passage 448 and the top of the fluid passage 476. Thus pressurized hydraulic fluid from the cavity 470 is provided to fluid passage 476 leading to the top of the intensifier piston 480 in the cavity 498. The application of pressurized hydraulic fluid to the top of the intensifier piston 480 forces the intensifier piston 480 downward in its cylinder or cavity 498. A plunger 500 operatively engages the intensifier piston 480 to apply a very high pressure force on fuel within the cavity 502. The pressure of the fuel entering the fuel injector 412 at inlet 429 may be about 450 kPa or 65 psi. The intensifier piston 480 may increase the pressure of fuel within a nozzle cavity 504 to about 175 Mpa or 25,000 psi as a function of the rail pressure. An inlet fill check valve 507 prevents the high pressure fuel from flowing back out of the inlet port 429. Of course, other fuel pressures are possible as well without departing from the spirit and scope of the present invention.

Opening the control passage 452 to the drain passage 450 also removes the pressure of the hydraulic fluid over the check piston 486. As the pressure within the nozzle cavity 504 increases, a sufficient force builds up on the end 506 of the nozzle check valve 488 to overcome the force applied by the check piston return spring 508. The highly pressurized fuel in the nozzle cavity 504 effectively pushes the nozzle check valve 488 and the check piston 486 against the spring 508. The end 506 of the nozzle check valve 488 is separated from its seat in the tip 490, and highly pressurized fuel freely flows through the orifice or orifices 510 into the cylinder. The pilot injection phase continues as long as the bender actuator 419 remains actuated; the spool valve 421 remains open; and there is no pressurized hydraulic fluid on top of the check piston 486.

Figure 15A:
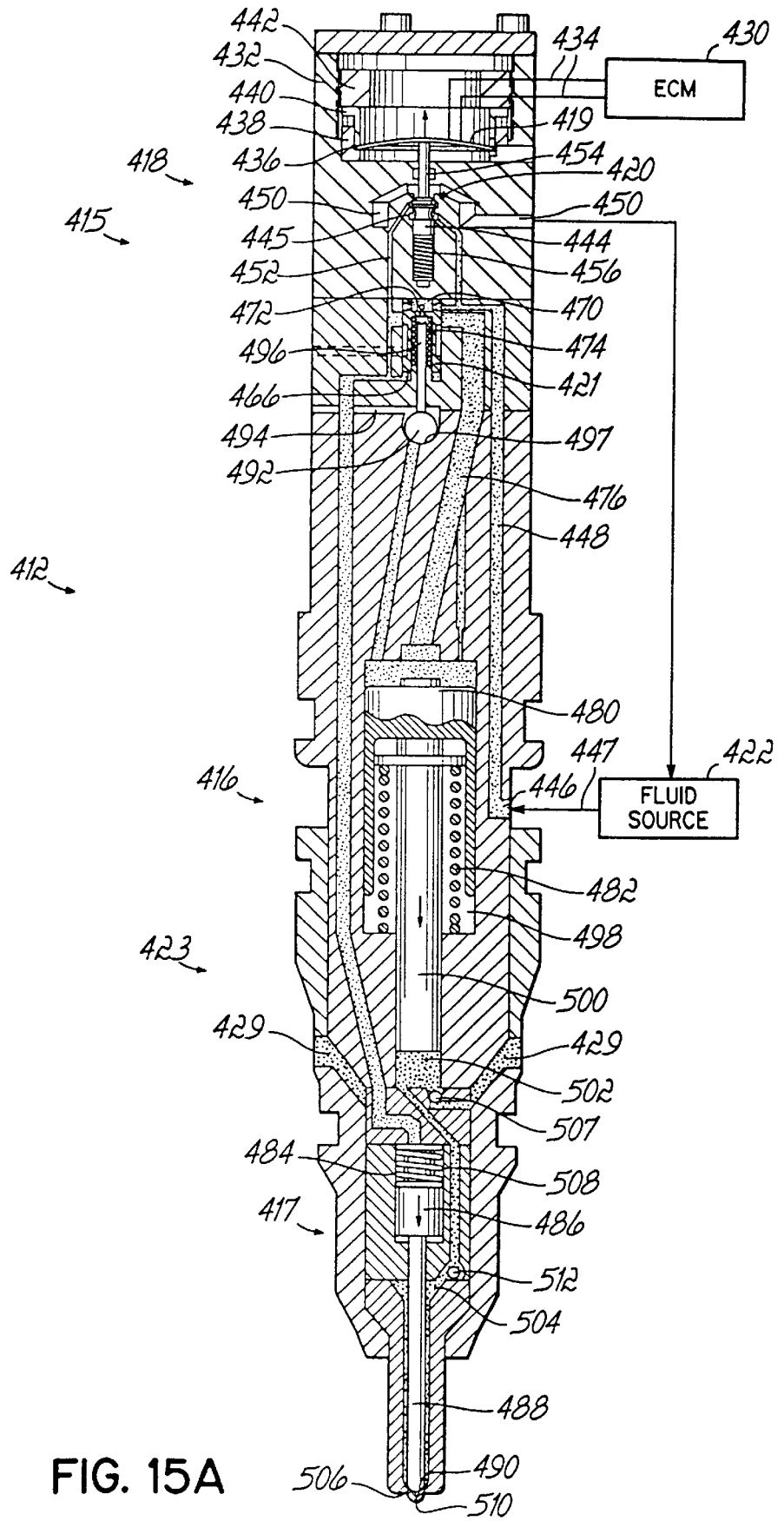
FIGS. 15A and 15B are cross-sectional views of the fuel injector used in the system of FIG. 12 illustrating the states of components within the fuel injector during an injection delay phase of a fuel injection cycle.
Figure 15B:
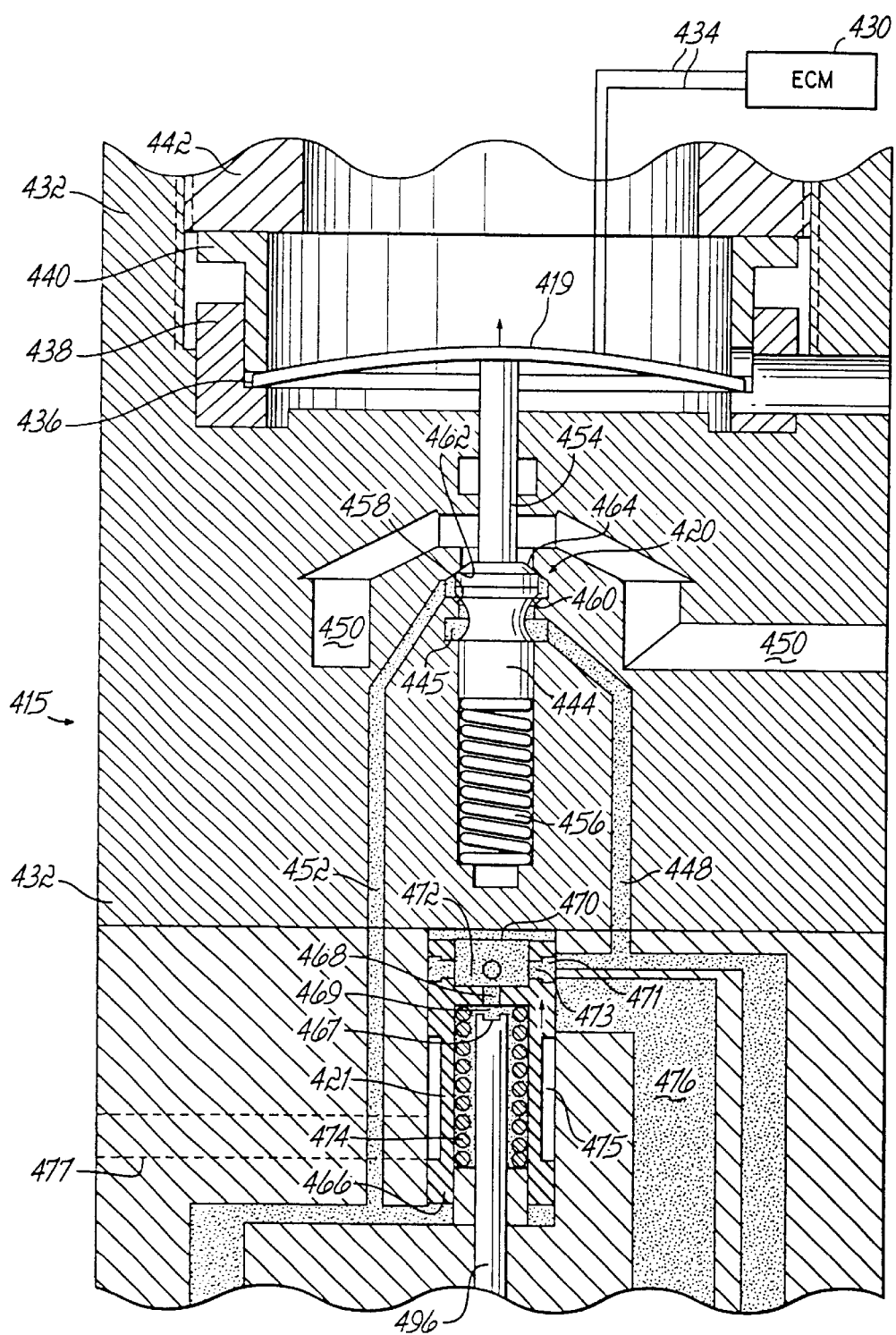

Subsequently, during the engine operation, an injection delay phase is initiated by the ECM 430 providing to the bender actuator 419 a second command signal such as a DC biasing voltage of an opposite polarity from the first command signal. The second command signal causes the bender actuator 419 to move in a second direction opposite the first direction, such as a generally vertically upward direction. The bender actuator 419 moves to a more domed, quiescent prestressed, second position as shown in FIGS. 15A and 15B. As the bender actuator 419 moves upward, the return spring 456 moves the poppet 420 and actuating pin 454 upward to a second position, such that the actuating pin 454 contacts the center portion of the bender actuator 419.

Motion of the poppet 420 upward causes the second sealing area 462 to engage the upper seat 464, thereby disconnecting the control passage 452 from the drain passage 450. Simultaneously, the first annular sealing area 458 separates from the lower seal 460; and pressurized hydraulic fluid flows from the supply passage 448 to the control passage 452. The reapplication of pressurized hydraulic fluid to the control passage 452 creates a hydraulic force on top of the check piston 486. The check piston 486 and nozzle check valve are moved downward until the end 506 engages the tip 490, thereby closing the nozzle check valve 488. With the nozzle check valve closed, the flow of fuel from the output orifice 510 of the fuel injector 412 is terminated. Thus, injection of fuel into the cylinder is terminated immediately after deactuating the bender actuator 419.

The application of pressurized hydraulic fluid to the control passage 452 again applies a hydraulic fluid force to the bottom 466 of the spool 421. That force in combination with a relatively weak force of the return spring 456 is slow to overcome the force of the pressurized hydraulic fluid on the upper end 472 of the spool valve 421. Thus, the spool valve 421 is slow to move upward relative to the speed of closing of the nozzle check valve 488. During this period of initial slow operation of the spool valve 421, pressurized hydraulic fluid continues to flow past the spool valve 421 to the intensifier piston 480. With the nozzle check valve 488 closed and the continued application of a hydraulic force to the intensifier piston 480 and the plunger 500, the piston 480 and plunger 500 continue to move downward. The continued movement of the intensifier piston 480 and plunger 500 again brings the fuel in the cavities 502 and 504 to the desired injection pressure in anticipation of the main injection phase. The duration of the injection delay phase is sufficiently small that the spool valve 421 never shuts off the supply of pressurized hydraulic fluid to the top of the intensifier piston 480.

Figure 16:
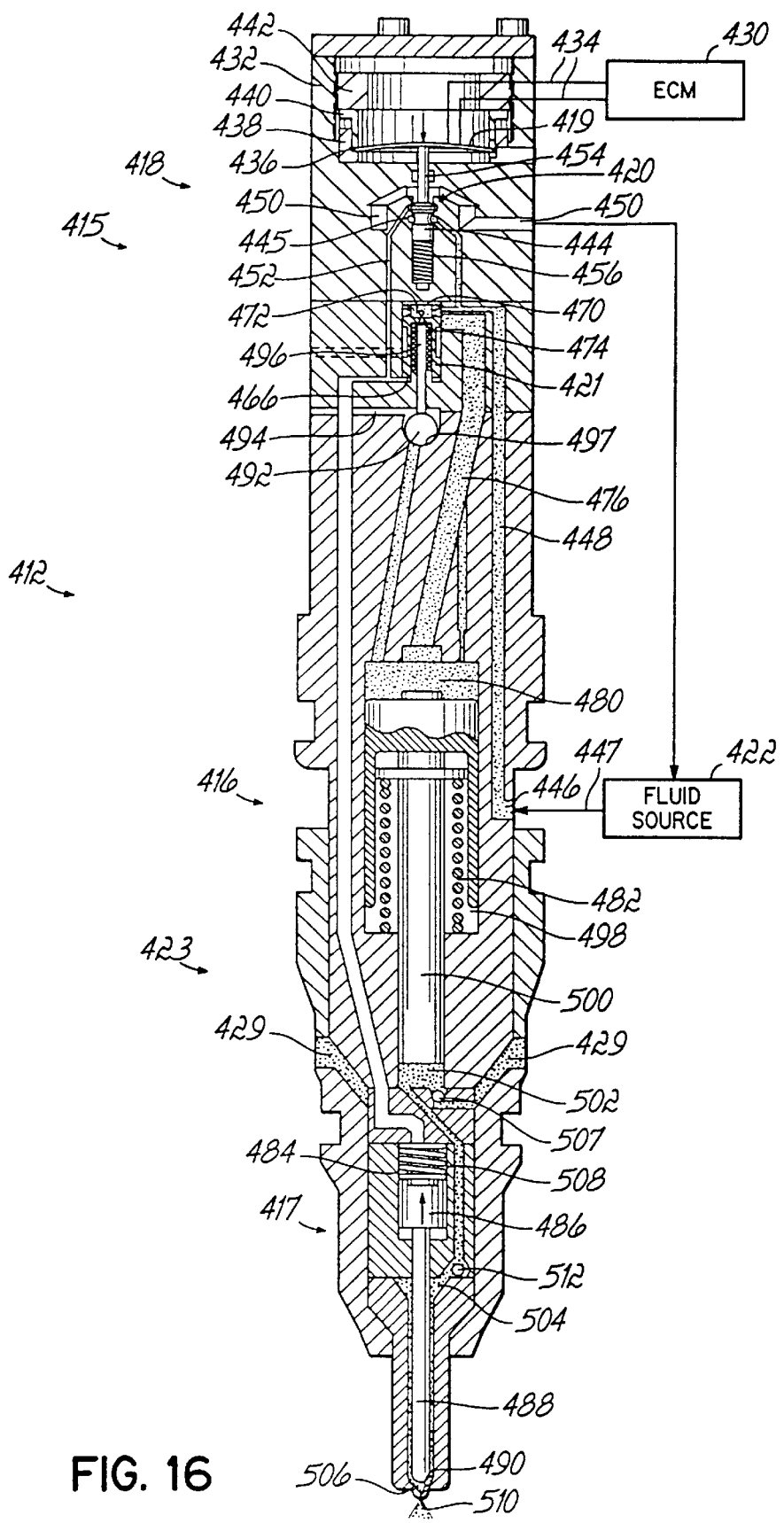
FIG. 16 is cross-sectional views of the fuel injector used in the system of FIG. 12 illustrating the states of components within the fuel injector during a main injection phase of a fuel injection cycle.

Subsequently, during the engine operation, the main injection phase is initiated by the ECM 430 providing a third command signal to actuate the bender actuator 419. The third command signal is similar to the first command signal that is described with respect to the pilot injection phase. The third command signal is effective to cause the bender actuator 419 to move downward to its actuated, less domed, first position as illustrated in FIG. 16. The poppet valve 420 again changes state and returns to its first position, thereby opening the control passage 452 to the drain passage 450. Pressure is immediately removed from the check piston 486, and the fuel in the cavity 504 that was pressurized during the delay cycle is effective to quickly open the nozzle check valve 488.

Simultaneously, removal of hydraulic pressure from the bottom 466 of the spool valve 421 quickly opens the partially closed spool valve 421, thereby applying full hydraulic fluid pressure to the top of the intensifier piston 480. The intensifier piston 480 and plunger 500 continue their downward movement to maintain the desired injection pressure on the fuel in the cavities 502, 504. The main injection phase continues for as long as the bender actuator 419 remains in its actuated state.

The main injection phase ends and the fill phase begins when the ECM 430 provides a fourth command signal to the bender actuator 419. The fourth command signal is similar to the second command signal and causes the bender actuator 419 to move in the second, upward direction to its second, more domed, quiescent prestressed position as shown in FIG. 13A. Again, in a manner similar to that described with respect to the delay phase, the poppet valve 420 moves upward to its second position, thereby again applying pressurized hydraulic fluid to the control passage 452 and the top of the check piston 486. The check piston 486 moves downward, thereby immediately closing the nozzle check valve 488 and terminating the flow of pressurized fuel through the orifice 510 of the fuel injector 412.

The pressurized hydraulic fluid in the control passage 452 also reestablishes a hydraulic force balance at the ends of the spool valve 421, thereby permitting the return spring 474 to return the spool valve 421 to its closed position. Closing the spool valve 421 terminates the flow of pressurized hydraulic fluid from the supply passage 448 to the fluid passage 476. Also, the fluid passage 476 is opened to the annulus 475, so that hydraulic fluid pressure in the passage 476 is relieved through the drain 477. Further, as the spool valve raises away from the spool pin 496, the ball check valve 492 is able to release the pressure of the hydraulic fluid in the passage 476 via the vent 494.

As the pressurized hydraulic fluid is removed from the top of the intensifier piston 480, the return spring 482 pushes hydraulic fluid out of the cavity above the intensifier piston 480. The reverse check valve 507 for the fuel inlet is lifted to its valve seat as the plunger 500 is raised. This allows fuel to flow into the plunger cavity 502. The fill cycle is complete when the plunger 500 and intensifier piston 480 are at their uppermost positions and the plunger cavity 502 is filled with fuel as shown in FIGS. 13A and 13B. At the end of the fill cycle, all of the components of the fuel injector 412 are in respective states that define the preinjection phase; and the fuel injector is ready for the next fuel injection cycle.

While the use of hydraulic fluid is described herein, those of ordinary skill in the art will appreciate that other fluids may be used as well, such as engine oil, fuel, transmission fluid, power steering fluid, and engine coolant by way of example without departing from the spirit and scope of the present invention. Moreover, it will be understood that the check valve 488 may be caused to open and close several times during an injection cycle so as to provide, for example, pilot, main and post injections.

Figure 17:
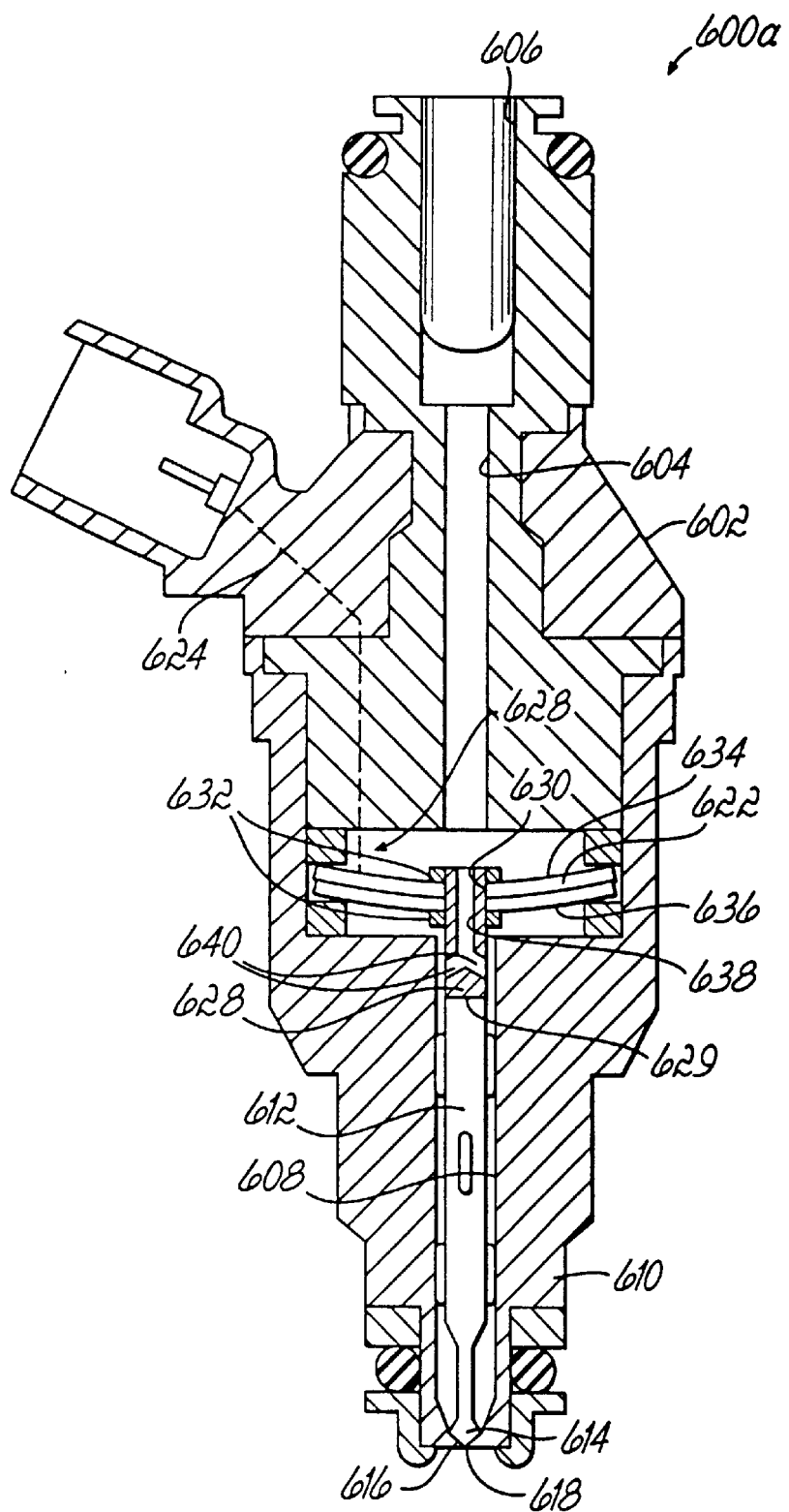
FIG. 17 is a schematic cross-sectional view illustrating a gasoline port injector in accordance with one embodiment of the present invention.
Figure 18:
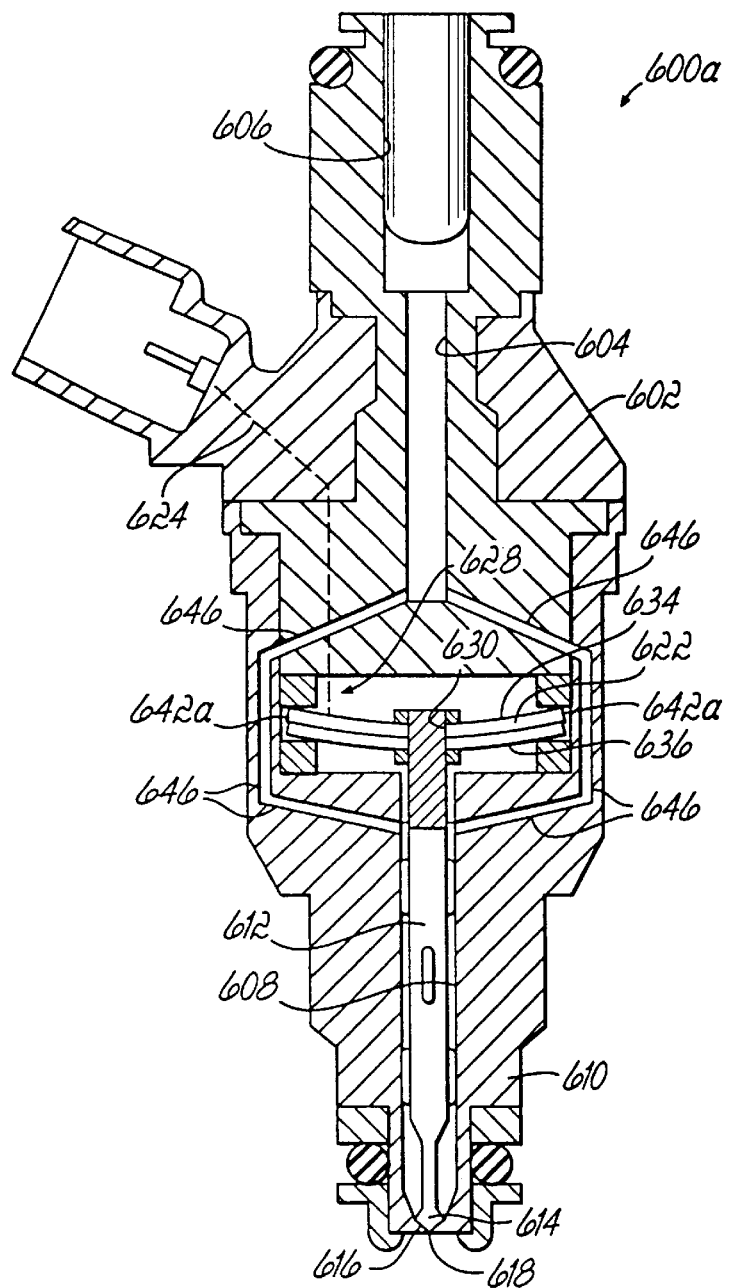
FIG. 18 is a schematic cross-sectional view illustrating a gasoline port injector in accordance with a second embodiment of the present invention.
Figure 19:
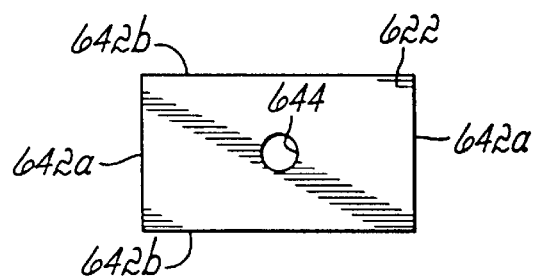
FIG. 19 is a schematic illustration of one embodiment of a pre-stressed electroactive bender actuator used in the gasoline port injector of FIG. 18.

With reference now to FIGS. 17–19, gasoline port injector 600a and 600b are shown in accordance with the principles of the present invention. Port injector 600a includes a valve body 602 having an axial fluid passage 604 extending through the valve body 602 that communicates between an inlet 606 and a fluid chamber 608 formed in the injector tip 610. An elongated needle valve 612 is mounted to extend axially through the valve body 602 and includes a valve tip 614 that normally seats in a valve seat 616 to close a fluid orifice 618 formed at the remote end of the injector tip 610. The needle valve 612 is mounted for reciprocal movement within the valve body 602 for selectively opening and closing the orifice 618 during an injection cycle.

In accordance with one embodiment of the present invention, as shown in FIG. 17, the needle valve 602 is rigidly connected to at least one piezoelectric device 622, such as a pre-stressed electroactive bender actuator, which may be thermally, mechanically or otherwise prestressed, as described in detail above. The bender actuator 622 may have a cylindrical or disk configuration and may be coated with an electrically insulating and/or otherwise protective material as is well known in the art.

Bender actuator 622 may comprise a plurality of benders actuators (configured in parallel or in series) that are individually stacked or bonded together into a single multi-layered element. While not shown, those of ordinary skill in the art will appreciate that multiple bender actuators 622 may be mounted in parallel within the valve body 602 to increase the force applied by the bender actuators 622 to the needle valve 612 in response to a control signal applied by the ECM (not shown) to the bender actuator 622 through electrical leads 624 (one shown). Alternatively, the bender actuators 622 may be mounted in series to increase the stroke of the needle valve 612 upon axial displacement of the bender actuators 622 in response to the control signal. The bender actuator 622 is mounted within the valve body 602 by a clamping and load ring assembly, illustrated diagrammatically at 628, as described in detail above in connection with FIGS. 7A, 7B, 8 and 11.

As shown in FIG. 17, a cylindrical coupling member 628 extends through a bore 630 formed through the center of the bender actuator 622 and is fixed to the actuator 622 through a pair of locking collars 632 that contact the major surfaces 634, 636 of the bender actuator 622 and may be threaded, welded, glued or otherwise fastened to the coupling member 628. One end of the coupling member 628 is operatively connected to the needle valve 612 through a fastener (not shown) or any other suitable means of attachment. Coupling member 628 includes an axial fluid passage 638 (FIG. 17) extending at least partially therethrough that is in fluid communication with fluid passages 640 extending through a wall of the coupling member 628. The passages 638, 640 permit fuel to pass from one side of the bender actuator 622 to the other side through the coupling member 628. As shown in FIG. 17, the needle valve 612 is connected to the bender actuator 622 through the coupling member 628 so that the needle valve 612 will travel axially within the valve body 602 upon axial displacement of the bender actuator 622 from the domed, or unactuated configuration shown in FIG. 17 to a flattened, or actuated position (not shown).

In operation of the gasoline port 600a of FIG. 17, the spring rate of the bender actuator 622 is used to bias the needle valve 612 to a closed position so that the valve tip 614 seats in the valve seat 616 to close the orifice 618. Fuel is delivered to the fluid chamber 608 in the injector tip 610 through the axial fluid passage 604 and the fluid passages 638, 640 that extend through the coupling member 628. During an injection cycle, the ECM (not shown) applies a control signal to the bender actuator 622 that causes the bender actuator 622 to deform or displace axially by flattening out. As the bender actuator 622 flattens out in response to the control signal, the needle valve 612, by virtue of its rigid connection to the bender actuator 622, lifts off of the valve seat 616 to open the orifice 618 for an injection of fuel. After the injection cycle is complete, the control signal is either discontinued, or the polarity of the control signal is reversed, to cause the bender actuator 622 to return to its domed configuration as shown in FIG. 17.

A gasoline port injector 600b in accordance with an alternative second embodiment of the present invention is shown in FIG. 18, where like numerals represent like parts to the gasoline port injector 600a of FIG. 17. In this embodiment, the bender actuator 622 may have a rectangular configuration as shown in FIG. 19, although other configurations are possible as well. The bender actuator 622 includes a pair of opposite minor sides 642a and a pair of opposite major sides 642b. A hole 644 is provided in the center of bender actuator 622 to permit direct attachment of the needle valve 612 to the actuator 622 through a suitable fastener (not shown) as described in detail above. In this embodiment, multiple fluid passages 646 communicate with the axial fluid passage 604 and are routed through the valve body 602 and around the minor sides 642a of the bender actuator 622. In this way, the coupling member 628 for passing the fluid through the bender actuator 622 may be eliminated.

Figure 20:
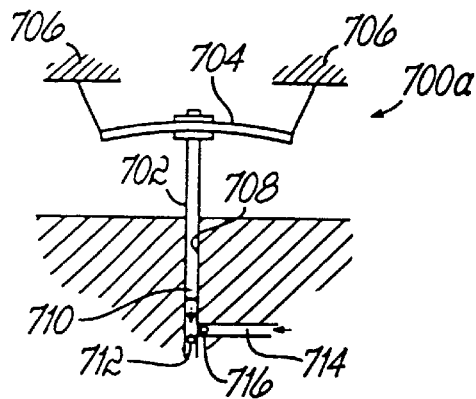
FIG. 20 is a schematic view illustrating a fluid metering valve in accordance with one embodiment of the present invention.

Referring now to FIG. 20, a fluid metering valve 700a in accordance with one embodiment of the present invention is shown. Fluid metering valve 700a includes a plunger or piston 702 that is directly connected to a bender actuator 704 as described in detail above. Bender actuator 704 is supported by a support, shown diagrammatically at 706, that may comprise the clamping and load ring assembly described in detail above in connection with FIGS. 7A, 7B, 8 and 11. Bender actuator 704 may have a cylindrical or disk configuration and include at least one electroactive layer (not shown) positioned between a pair of electrodes (not shown), although other configurations are possible as well without departing from the spirit and scope of the present invention. In a de-energized or static state, the bender actuator 704 is preferably pre-stressed to have a domed configuration as shown in FIG. 20.

When the electrodes (not shown) of the bender actuator 704 are energized to place the bender actuator 704 in an actuated state, such as when a voltage or current control signal is applied by an actuator control system (not shown), the bender actuator 704 displaces axially by flattening out from the domed configuration. In particular, the bender actuator 704 displaces axially, i.e., flattens out, in one direction when it is actuated in response to a control signal of one polarity. In a de-energized state, or in response to a control signal of an opposite polarity, the bender actuator 704 displaces axially, i.e., returns to its domed configuration, in an opposite direction or the bender actuator 704 may dome higher than its static state depending on the relayed control signal. The bender actuator 704 is therefore bidirectional in its operation as described in detail above.

A portion of the plunger 702 extends into a fluid reservoir chamber 708 having a variable volume defined by a lower end 710 of the plunger 702 and an outlet check valve 712. A fluid inlet passage 714 communicates with the fluid reservoir chamber 708 through an inlet check valve 716. The position of the lower end 710 of the plunger 702, and thus the volume of fluid in fluid reservoir chamber 708, may be accurately calibrated or controlled by varying the voltage or current applied to the bender actuator 704. Additionally, the static position of the bender actuator 704, and thus the static volume of the fluid reservoir chamber 708, may be adjusted by varying the pre-load applied to the bender actuator 704 through the clamping and load ring assembly, illustrated diagrammatically at 706.

Bender actuator 704 may comprise a plurality of bender actuators (configured in parallel or in series) that are individually stacked or bonded together into a single multi-layered element. While not shown, those of ordinary skill in the art will appreciate that multiple bender actuators 704 may be mounted in parallel to increase the force applied by the bender actuators 704 to the plunger 702 in response to a control signal applied by the actuator control system (not shown). Alternatively, the bender actuators 704 may be mounted in series to increase the stroke of the plunger 702 upon axial displacement of the bender actuators 704 in response to the control signal.

In operation, the fluid reservoir chamber 708 is filled with fluid through the fluid inlet passage 714 and the inlet check valve 716. During a fluid metering cycle, the bender actuator 704 is actuated by a control signal that causes the bender actuator 704 to displace axially, i.e., flatten out. The extent of the axial displacement, and therefore the metering stroke of the piston or plunger 702, is accurately controlled through the control signal applied to the bender actuator 704. The plunger 702 can be accurately stroked to any position within range of motion of the bender actuator 704 in response to the applied control signal. As the plunger 702 displaces axially, the increased pressure on the outlet check valve 712 causes the outlet check valve 712 to open, thereby permitting a volume of fluid to be metered through the fluid metering valve 700a. After a volume of fluid has been metered, the control signal is either discontinued, or the polarity of the control signal is reversed, to cause the bender actuator 704 to return to its domed configuration as shown in FIG. 20.

Figure 21:
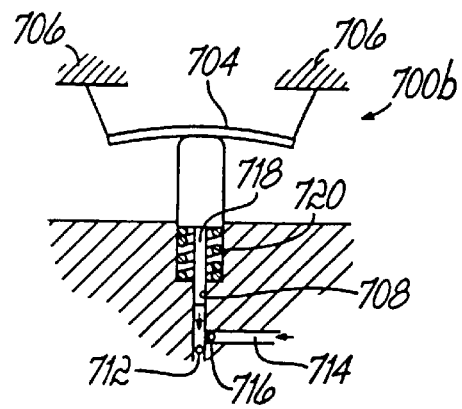
FIG. 21 is a schematic view illustrating a fluid metering valve in accordance with a second embodiment of the present invention.

Referring now to FIG. 21, a fluid metering valve 700b is shown in accordance with an alternative second embodiment of the present invention, where like numerals represent like parts to the fluid metering valve 700a of FIG. 20. In this embodiment, a plunger 718 is biased into engagement with the bender actuator 704 through a biasing element, such as return spring 720. It will be appreciated that biasing of the plunger 718 into engagement with the bender actuator 704 could be achieved through other mechanical or hydraulic means as well.

The plunger 718 engages the bender actuator 704 so that the plunger 718 will travel axially within the fluid reservoir chamber 708 upon axial displacement of the bender actuator 704 from the domed, or unactuated configuration shown in FIG. 21 to a flattened, or actuated position (not shown) during a fluid metering cycle. After a fluid metering cycle is complete, the control signal is either discontinued, or the polarity of the control signal is reversed, to cause the bender actuator 704 to return to its domed configuration as shown in FIG. 21. The return spring 720 returns the plunger 702 to its static position and maintains engagement of the plunger 702 with the bender actuator 704.

Figure 22:
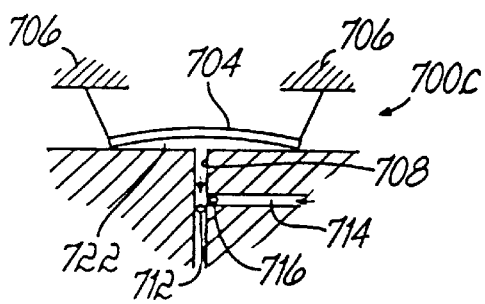
FIG. 22 is a schematic view illustrating a fluid metering valve in accordance with a third embodiment of the present invention.

Referring now to FIG. 22, a fluid metering valve 700c is shown in accordance with an alternative third embodiment of the present invention, where like numerals represent like parts to the fluid metering valve 700a of FIG. 20. In this embodiment, the plunger 702 is eliminated so that the bender actuator 704 acts directly upon the fluid within fluid reservoir chamber 708 during a fluid metering cycle. The fluid reservoir chamber 708 includes a sealed fluid chamber 722 that is formed beneath the bender actuator 704.

During a fluid metering cycle, the bender actuator 704 is actuated by a control signal that causes the bender actuator 704 to displace axially, i.e., flatten out, and thereby increase the fluid pressure within fluid chambers 708 and 722. The extent of the axial displacement of the bender actuator 704, and therefore the increase in fluid pressure within the chambers 708 and 722, is accurately controlled through the control signal applied to the bender actuator 704. The increased pressure on the outlet check valve 712 causes the outlet check valve 712 to open, thereby permitting a volume of fluid to be metered through the fluid metering valve 700c. After a volume of fluid has been metered, the control signal is either discontinued, or the polarity of the control signal is reversed, to cause the bender actuator 704 to return to its domed configuration as shown in FIG. 22.

Figure 23:
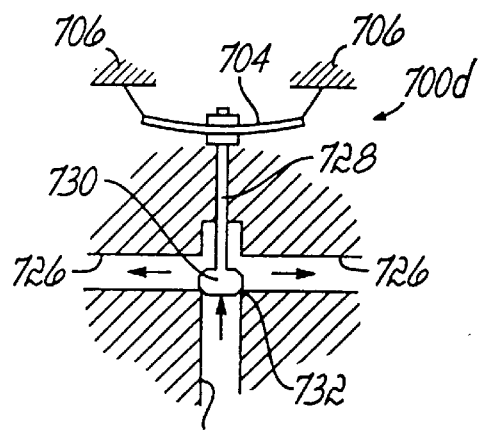
FIG. 23 is a schematic view illustrating a fluid metering valve in accordance with a fourth embodiment of the present invention.

Referring now to FIG. 23, a fluid metering valve 700d is shown in accordance with an alternative fourth embodiment of the present invention, where like numerals represent like parts to the fluid metering valve 700a of FIG. 20. In this embodiment, fluid metering valve 700d includes an inlet fluid passage 724 and one or more outlet fluid passages 726 (two shown) communicating with the inlet fluid passage 724. A control valve 728 selectively seals the outlet fluid passages 726 from the inlet fluid passage 724 when a closing head 730 of the control valve 728 engages a valve seat 732.

One end of the control valve 728 remote from the closing head 730 is directly connected to the bender actuator 704 in a manner as described in detail above. Other mountings of the bender actuator 704 and the control valve 728 are possible as well without departing from the spirit and scope of the present invention. The control valve 728 is mounted for reciprocal movement for selectively opening and closing a fluid passage between the inlet fluid passage 724 and the outlet fluid passages 726 through bidirectional operation of the bender actuator 704.

In operation, a control signal of a predetermined magnitude is applied to the bender actuator 704 for a predetermined duration of time to cause the bender actuator 704 to displace axially, i.e., flatten out. The extent of the axial displacement of the closing head 730 from the valve seat 732 is accurately controlled through the control signal applied to the bender actuator 704 from an actuator control system (not shown). The actuator control system (not shown) may include a programmable timer to control the duration of time the control valve 728 is held in the open position. A fluid pressure sensor (not shown) may be associated with the inlet fluid passage 724 and coupled to the actuator control system (not shown) for monitoring the fluid pressure within the inlet fluid passage 724. Alternatively, the bender actuator 704 may be used as a pressure sensor so that the bender actuator 704 has a voltage or current output that is generally proportional to the fluid pressure within the inlet fluid passage 724.

The actuator control system (not shown) is programmed to open the control valve 728 so that a predetermined volume of fluid is metered through the outlet fluid passages 726. As those of ordinary skill in the art will appreciate, the metered volume of fluid is determined by the fluid pressure within the inlet fluid passage 724 and the duration time the control valve 728 is opened by the bender actuator 704.

Figure 24:
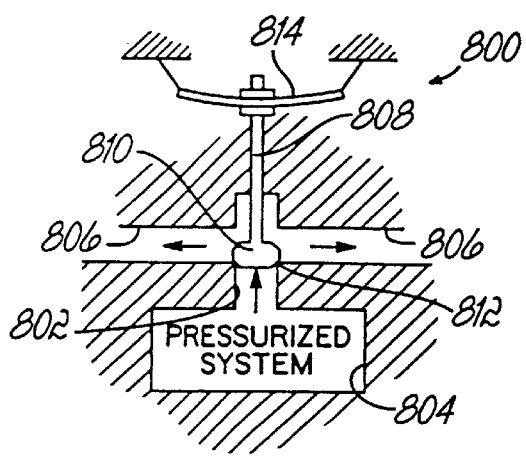
FIG. 24 is a schematic view illustrating a relief valve or a reducing valve in accordance with one embodiment of the present invention.

Referring now to FIG. 24, a relief or reducing valve 800 in accordance with the principles of the present invention is shown. In this embodiment, relief or reducing valve 800 includes an inlet fluid passage 802 communicating with a pressurized fluid system 804, and one or more outlet fluid passages 806 (two shown). A control valve 808 selectively seals the outlet fluid passages 806 from the inlet fluid passage 802 when a closing head 810 of the control valve 808 engages a valve seat 812. The closing head 810 of the relief or reducing valve 800 could be an angled seat type, flat seat type, needle valve type, spool valve type, poppet valve type, or other valve type known to those of skill in the art.

One end of the control valve 808 remote from the closing head 810 is directly connected to a bender actuator 814 in a manner as described in detail above. Other mountings of the bender actuator 814 and control valve 808 are possible as well without departing from the spirit and scope of the present invention. The control valve 808 is mounted for reciprocal movement for selectively opening and closing a fluid passage between the inlet fluid passage 802 and the outlet fluid passages 806 through bidirectional operation of the bender actuator 814. As will be described in detail below, in one embodiment where the control valve 808 is a relief valve, the control valve 808 is selectively opened to avoid pressure extremes in the pressurized system 804. Alternatively, in one embodiment where the control valve 808 is a reducing valve, the control valve 808 is selectively opened to provide a reduced fluid pressure in the outlet fluid passages 806, such as for use in brake systems, differential locks, power-take-off clutches and other systems requiring a controlled fluid pressure within the system.

In operation, the bender actuator 814 may be used as a pressure sensor so that the bender actuator 814 has a voltage or current output that is generally proportional to the fluid pressure within the inlet fluid passage 802 and the pressurized system 804. Alternatively, a separate pressure sensor (not shown) could be used. An actuator control system (not shown) receives the pressure information from the bender actuator 814 or a separate fluid pressure sensor (not shown) and opens the control valve 808 through a control signal of predetermined magnitude so that either extreme pressures in the pressurized system 804 are avoided or, alternatively, the fluid pressure in the outlet fluid passages 806 is reduced to a predetermined pressure. In one embodiment where the control valve 808 is a relief valve, after the fluid pressure is relieved, the control signal is either discontinued, or the polarity of the control signal is reversed, to cause the bender actuator 814 to return to its domed configuration as shown in FIG. 24 to seat the closing head 810 on the valve seat 812. In one embodiment where the control valve 808 is a reducing valve, the control signal is adjusted to open or restrict the fluid passage between the inlet fluid passage 802 and the outlet fluid passages 806 to maintain the desired fluid pressure in the outlet fluid passages 806.

Figure 25:
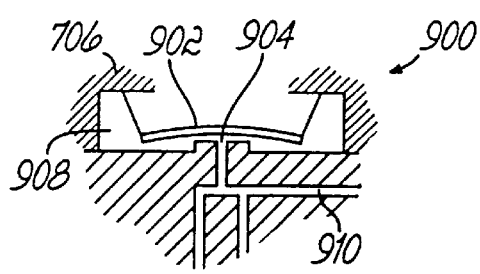
FIG. 25 is a schematic view illustrating a direct valve in accordance with one embodiment of the present invention.

Referring now to FIG. 25, a direct valve 900 in the form of a piezoelectric device, such as a bender actuator 902 as described in detail above, is provided to selectively open and close a fluid aperture 904. The bender actuator 902 is supported in a support, shown diagrammatically at 906, that forms a fluid seal about the entire periphery of the bender actuator 902. The bender actuator 902 and the fluid seal around the entire periphery of the actuator 902 form a fluid chamber 908 that communicates with the fluid aperture 904 and fluid passages 910. Additional fluid apertures (not shown) may communicate with the fluid chamber 908.

The bender actuator 902 may have a cylindrical or disk configuration and may be coated with an electrically insulating and/or otherwise protective material as well known in the art.

In a de-energized or static state, the bender actuator 902 is preferably pre-stressed to have a domed configuration as shown in FIG. 25 so that the fluid aperture 904 is opened. When the electrodes (not shown) of the bender actuator 902 are energized to place the bender actuator 902 in an actuated state, such as when a voltage or current control signal is applied by an actuator control system (not shown), the bender actuator 902 displaces axially by flattening out from the domed configuration to directly seal with the fluid aperture 904 to prevent the flow of fluid from the fluid chamber 908 to the fluid passages 910.

Of course, the orientation and operation of the bender actuator 902 could be changed so that the bender actuator 902 directly seals the fluid aperture 904 in its static, or unactuated state, and opens the fluid aperture 904 in its actuated state.

Figure 26:
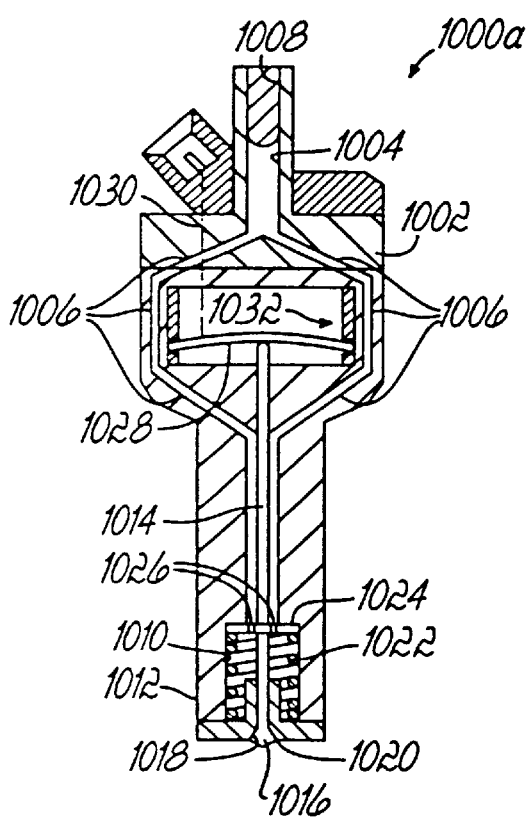
FIG. 26 is a schematic view illustrating a direct-injection gasoline injector in accordance with one embodiment of the present invention.
Figure 27:
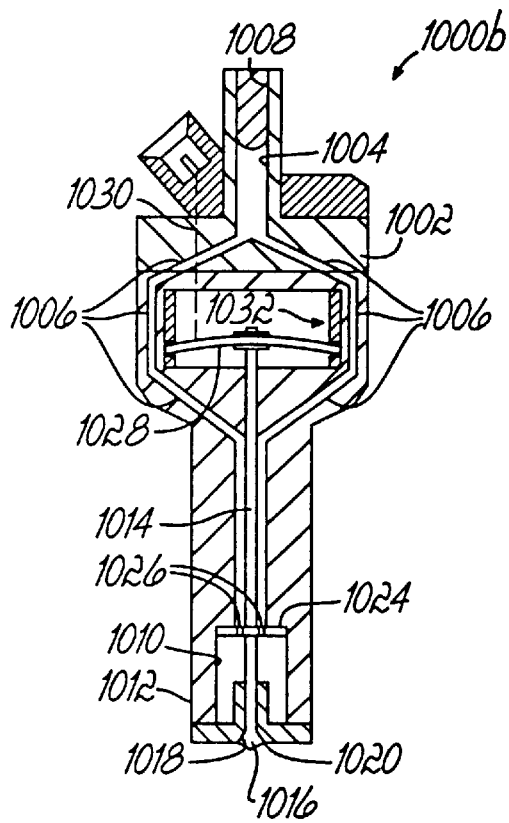
FIG. 27 is a schematic view illustrating a direct-injection gasoline injector in accordance with a second embodiment of the present invention.

With reference now to FIGS. 26–27, direct-injection gasoline injectors 1000a and 1000b are shown in accordance with the principles of the present invention. Injector 1000a includes a valve body 1002 having an axial fluid passage 1004 and multiple fluid passages 1006 extending through the valve body 1002 that communicate between an inlet 1008 and a fluid chamber 1010 formed in the injector tip 1012. An outwardly opening, elongated check valve 1014 is mounted to extend axially through the valve body 1012 and includes a closing head 1016 that normally seats in a conically-shaped valve seat 1018 to close a fluid orifice 1020 formed at the remote end of the injector tip 1012. The check valve 1014 is biased to the closed position by a biasing element, such as by a return spring 1022, that acts on an annular flange 1024 extending radially outwardly from the check valve 1014. The annular flange 1024 includes multiple apertures 1026 that permit fluid flow from the axial fluid passage 1004 to the fluid chamber 1010. While not shown, it will be appreciated in an alternative embodiment that the fluid may be diverted around the annular flange 1024 through one or more fluid passages formed in the valve body 1002 (not shown). The check valve 1014 is mounted for reciprocal movement within the valve body 1002 for selectively opening and closing the orifice 1020 during an injection cycle.

In the embodiment of FIG. 26, one end of the check valve 1014 remote from the closing head 1016 engages at least one bender actuator 1028, such as a pre-stressed electroactive bender actuator, which may be thermally, mechanically or otherwise prestressed, as described in detail above. The check valve 1014 engages the bender actuator 1028 so that the check valve 1014 will travel axially within the valve body 1002 upon axial displacement of the bender actuator 1028 from the domed, or unactuated configuration shown in FIG. 26 to a flattened, or actuated position (not shown).

The bender actuator 1028 may have a rectangular configuration as shown in FIG. 19, although other configurations are possible as well. The bender actuator 1028 may be coated with an electrically insulating and/or otherwise protective material as well known in the art. Bender actuator 1028 may comprise a plurality of bender actuators (configured in parallel or in series) that are individually stacked or bonded together into a single multi-layered element. While not shown, those of ordinary skill in the art will appreciate that multiple bender actuators 1028 may be mounted in parallel within the valve body 1002 to increase the force applied by the bender actuators 1028 to the check valve 1014 in response to a control signal applied by the ECM (not shown) through electrical leads 1030 (one shown). Alternatively, the bender actuators 1028 may be mounted in series to increase the stroke of the check valve 1014 upon axial displacement of the bender actuators 1028 in response to the control signal. The bender actuator 1028 is mounted within the valve body 1002 by a clamping and load ring assembly, illustrated diagrammatically at 1032, as described in detail above in connection with FIGS. 7A, 7B, 8 and 11.

In operation of the direct-injection gasoline injector 1000a of FIG. 26, the return spring 1022 biases the outwardly opening check valve 1014 to a closed position so that the closing head 1016 seats in the conically-shaped valve seat 1018 to close the orifice 1020. Fuel is delivered to the chamber 1010 through the axial fluid passage 1004 and the multiple apertures 1026 formed in the annular flange 1024. During an injection cycle, the ECM (not shown) applies a control signal to the bender actuator 1028 that causes the bender actuator 1028 to deform or displace axially by flattening out. As the bender actuator 1028 flattens out in response to the control signal, the check valve 1014, by virtue of its engagement with the bender actuator 1028, is pushed off of the conically-shaped valve seat 1018 against the force of return spring 1022 to open the orifice 1020 for an injection of fuel. After the injection cycle is complete, the control signal is either discontinued, or the polarity of the control signal is reversed, to cause the bender actuator 1028 to return to its domed configuration as shown in FIG. 26. The return spring 1022 assists in returning the check valve 1014 to its closed position so that the closing head 1016 engages the conically-shaped valve seat 1018 to seal the orifice 1020.

Referring now to FIG. 27, a direct-injection gasoline injector 1000b in accordance with an alternative second embodiment of the present invention is shown, where like numerals represent like parts to the gasoline injector 1000a of FIG. 26. In this embodiment, the elongated check valve 1014 is rigidly connected to the bender actuator 1028 in a manner as described in detail above so that the bi-directional operation of the bender actuator 1028 is used to move the check valve 1014 to both its open and closed positions. The rigid connection of the check valve 1014 to the bender actuator 1028 permits the return spring 1022 to be eliminated so that the bender actuator 1028 provides the necessary force to return the check valve 1014 to its closed position. As described in detail above, the spring rate of the bender actuator 1028 may be adjusted by the clamping and load ring assembly 1032 to pre-load the check valve 1014 against the conically-shaped valve seat 1018.

Industrial Applicability

The common rail fuel injectors 100a–100e of the present invention have many advantages over common rail fuel injectors of the prior art. In each of the embodiments of FIGS. 1–4, the bender actuator 122 directly controls the opening and closing of the elongated needle valve 110 and check valve 138. Therefore, the hydraulic control chamber normally associated with common rail fuel injectors is eliminated. This removes a source of variability in the operation of the common rail fuel injectors 100a–100d, and results in more precise and accurate control over fuel metering during an injection cycle. In the common rail fuel injector 10e, the bender actuator 122 directly controls the opening and closing of the control valve 170 to selectively communicate the control fluid chamber 156 to the drain 171. This results in a more precise and accurate control over fuel metering during an injection cycle than provided by solenoid, piezoelectric stack or magnetorestrictive rod actuated control valves found in common rail fuel injectors of the prior art.

The improved electrohydraulic actuator 310 of the present invention uses a bender actuator 312 as a mechanical power source. The bender actuator 312 is physically small, uses little power, has very fast response times and has a proportionally controllable bidirectional operation. Thus, the electrohydraulic actuator 310 is relatively small, has great flexibility, and is power efficient.

Further, the use of a bender actuator 312 in the electrohydraulic actuator 310 provides significant advantages over electromagnetic solenoids. First, the small mass and low inertia of a bender actuator 312 provides it with extremely fast response times, such as approximately 150 microseconds. The fast response time allows for a very fast switching time of the poppet 330 as well as the device 315. Thus, the very fast response time of the electrohydraulic actuator 310 permits the electrohydraulic actuator 310 to be used in a wide range of applications.

The bender actuator 312 has a further advantage of having a capability of proportional bidirectional operation. Thus, the poppet 330 can be moved in both directions by means of different such as positive and negative command signals. This allows for either the elimination of a return spring 346 or the use of a substantially smaller return spring 346. In addition, the capability of proportional bidirectional control provides an electrohydraulic actuator 310 that has the capability of adjusting the velocity of the poppet 330 and the valve 314 hydraulically connected to the poppet 330.

The bender actuator 312 has a still further advantage in that it draws considerably less power than an electromagnetic solenoid. Further, dire to its capacitive behavior, a bender actuator 312 draws no power during a "hold-in" period where actuation is maintained for a relatively long period of time.

In addition, multiple bender actuators 312 may be easily combined in a stacked, parallel manner to provide a force that is approximately linearly related to the number of actuators in the stack. In addition, the actuators may be combined in a serial manner to increase the magnitude of the stroke, that is, tile displacement. Even in a stacked arrangement, actuators are relatively small and may take up less space than electromagnetic solenoids and piezoelectric stacks.

The fuel injector 412 of the present invention provides many advantages over solenoid-controlled fuel injectors of the prior art. For example, it is often difficult to accurately control movement of solenoid-controlled fuel injector valves through control signals applied to the solenoid, especially when intermediate positioning of the solenoid-controlled valve is desired such as in operation of the poppet and spool valves, 420 and 421, respectively. Factors such as inductive delays, eddy currents and variability in components (i.e., spring preloads, solenoid force characteristics and varying fluid flow forces) must ail be considered and accounted for in a solenoid-controlled fuel injector design. Further, the response time of solenoids limits the minimum possible dwell times between multiple injection events and makes the fuel injector generally more susceptible to various sources of variability. Additionally, components of a solenoid generally increase the overall mass and power requirements of a solenoid-controlled fuel injector system.

The prestressed bender actuator 419 of the present invention eliminates the drawbacks of known solenoid-controlled valves by providing rapid, accurate, and repeatable controlled movement of the poppet and spool valves, 420 and 421, respectively, between their open, partially open and closed positions. The bender actuator 419 of the present invention is a generally lightweight, proportional device having a stroke output that is proportional to the input control signal. Accurate, repeatable bidirectional movement of the poppet and spool valves, 420 and 421, respectively, is controlled simply by varying the magnitude and polarity of the control signal applied to the bender actuator 419. Further, the bender actuator 419 of the present invention has a fast response time so that dwell time between multiple injection events can be reduced, thereby also reducing variability from injection event to injection event. Additionally, prestressed bender actuator 419 acts as a capacitive load and will remain in its actuated position for a period of time after the ECM control signal is terminated unlike a solenoid that requires a continuous voltage signal during its actuation phase. Therefore, the fuel injector 412 of the present invention is generally lighter and requires less power for operation than solenoid-controlled fuel injectors of the past.

Gasoline port injectors 600a and 600b have the advantage that the needle valve 612 used to open and close the fluid orifice 618 is controlled by the pre-stressed bender actuator 622 having all of the advantages described in detail above in connection with bender actuators 312 and 419.

In the fluid metering valves 700a and 700b, the bender actuator 704 provides very accurate and repeatable bidirectional movement of the plungers 702 and 718 in the fluid reservoir chambers 708 to provide precise metering of fluid from the outlet check valves 712.

In the fluid metering valve 700c, the axial movement of the bender actuator 704 is accurately controlled to increase the fluid pressure in the fluid reservoir chamber 708 and sealed fluid chamber 722. The increase in fluid pressure is accurately controlled to meter a volume of fluid through the outlet check valve 712.

In the fluid metering valve 700d, the bender actuator 704 is used to control the position of control valve 728 relative to the valve seat 732. The programmable timer coupled to the actuator control system controls the duration of time the control valve 728 is opened, while the fluid pressure sensor associated with the inlet fluid passage 724 and coupled to the actuator control system monitors the fluid pressure within the inlet fluid passage 724. The volume of fluid metered by the metering valve 700d is determined by the fluid pressure within the inlet fluid passage 724 and the duration of time the control valve 728 is opened by the bender actuator 704.

In the relief or reducing valve 800, the bender actuator 814 is used to control the position of control valve 808. Control valve 808 controls communication of the inlet fluid passage 802 and the outlet fluid passages 806. In one embodiment, where the control valve 808 is a relief valve, the control valve 808 is selectively opened to avoid pressure extremes in the pressurized system 804. Alternatively, in one embodiment where the control valve 808 is a reducing valve, the control valve 808 is selectively opened to provide a reduced fluid pressure in the outlet fluid passages 806.

In the direct valve 900, the bender actuator 902 is use to selectively open and close fluid aperture 904. In a de-energized or static state, the bender actuator 902 is preferably pre-stressed to have a domed configuration as shown in FIG. 25 so that the fluid aperture 904 is opened. When the electrodes (not shown) of the bender actuator 902 are energized to place the bender actuator 902 in an actuated state, such as when a voltage or current control signal is applied by an actuator control system (not shown), the bender actuator 902 displaces axially by flattening out from the domed configuration to directly seal with the fluid aperture 904 to prevent the flow of fluid from the fluid chamber 908 to the fluid passages 910.

Direct-injection gasoline injectors 1000a and 1000b have the advantage that the check valve 612 used to open and close the fluid orifice 1020 is controlled by the pre-stressed bender actuator 1028 having all of the advantages described in detail above in connection with bender actuators 312 and 419.

While the present invention has been illustrated by a description of various embodiments, and while these embodiments have been described in considerable detail, it is not the intention of Applicants to restrict or in any way limit the scope of the appended claims to such detail. Additional advantages and modifications will readily appear to those skilled in the art. The invention in its broader aspects is, therefore, not limited to the specific details, representative apparatus and method, and illustrative example shown and described. Accordingly, departures may be made from such details without departing from the spirit or scope of Applicants' general inventive concept.

What is claimed is:

1. An apparatus for adjusting a preload of a piezoelectric device having first and second opposed surfaces and a peripheral edge extending therebetween, comprising:

a clamping device configured to engage the first and second opposed surfaces of the piezoelectric device proximate the peripheral edge and operable to apply a variable clamping force to the piezoelectric device; and a load device operatively engaging said clamping device and operable to vary the applied clamping force to adjust the reload of the piezoelectric device, wherein the clamping device comprises:

a first clamping member operable to engage the first surface of the piezoelectric device; and a second clamping member mounted for movement relative to the first clamping member and operable to engage the second surface of the piezoelectric device, and wherein the first clamping member comprises:

a first upstanding wall adapted to surround at least a portion of the peripheral edge of the piezoelectric device; and a first support flange extending from the first upstanding wall and adapted to engage the first surface of the piezoelectric device proximate the peripheral edge.

2. The apparatus of claim 1 wherein the second clamping member comprises:

a second upstanding wall positioned adjacent the first upstanding wall of the first clamping member and adapted to engage the second surface of the piezoelectric device proximate the peripheral edge.

3. The apparatus of claim 2 wherein the load device operatively engages one of the first and second clamping members for moving one of the first and second clamping members relative to the other.

4. An apparatus for adjusting a preload of a piezoelectric device having first and second opposed surfaces and a peripheral edge extending therebetween, comprising:

a clamping device configured to engage the first and second opposed surfaces of the piezoelectric device proximate the peripheral edge and operable to apply a variable clamping force to the piezoelectric device; and a load device operatively engaging said clamping device and operable to vary the applied clamping force to adjust the preload of the piezoelectric device, wherein said clamping device comprises a generally annular ring.

5. The apparatus of claim 4, wherein said second clamping member comprises a generally annular ring.

6. The apparatus of claim 5, wherein said load device comprises a generally annular ring.

7. An apparatus for adjusting a preload of a piezoelectric device having first and second opposed surfaces and a peripheral edge extending therebetween, comprising:

a housing;

a cavity disposed in said housing and having upstanding walls defining said cavity;

a clamping device mounted in said cavity and configured to engage the first and second opposed surfaces of the piezoelectric device proximate the peripheral edge and operable to apply a variable clamping force to the piezoelectric device; and a load device mounted in said cavity and threadably engaging said walls of said cavity, said load device operatively engaging said clamping device and being operable to vary the applied clamping force to adjust the preload of the piezoelectric device, wherein the clamping device comprises:

a first clamping member operable to engage the first surface of the piezoelectric device; and a second clamping member mounted for movement relative to the first clamping member and operable to engage the second surface of the piezoelectric device, wherein the first clamping member comprises:

a first upstanding wall adapted to surround at least a portion of the peripheral edge of the piezoelectric device; and a first support flange extending from the first upstanding wall and adapted to engage the first surface of the piezoelectric device proximate the peripheral edge.

8. The apparatus of claim 7 wherein the second clamping member comprises:

a second upstanding wall positioned adjacent the first upstanding wall of the first clamping member and adapted to engage the second surface of the piezoelectric device proximate the peripheral edge.

9. The apparatus of claim 8 wherein the load device operatively engages one of the first and second clamping members for moving one of the first and second clamping members relative to the other.

10. An apparatus for adjusting a preload of a piezoelectric device having first and second opposed surfaces and a peripheral edge extending therebetween, comprising:

a housing;

a cavity disposed in said housing and having upstanding walls defining said cavity;

a clamping device mounted in said cavity and configured to engage the first and second opposed surfaces of the piezoelectric device proximate the peripheral edge and operable to apply a variable clamping force to the piezoelectric device; and a load device mounted in said cavity and operatively engaging said walls of said cavity, said load device operatively engaging said clamping device and being operable to vary the applied clamping force to adjust the preload of the piezoelectric device, wherein said clamping device comprises a generally annular ring.

11. The apparatus of claim 10, wherein said load device comprises a generally annular ring.

12. A method for adjusting a preload of a piezoelectric device having first and second opposed surfaces and a peripheral edge extending therebetween, comprising:

engaging the first surface of the piezoelectric device with a first clamping member;

engaging tie second surface of the piezoelectric device with a second clamping member; and moving the first and second clamping members relative to each other to apply a clamping force to the piezoelectric device that varies the preload of the piezoelectric device.

13. The method of claim 12 wherein engaging the first surface of the piezoelectric device comprises engaging the first surface of the piezoelectric device with the first clamping member proximate the peripheral edge.

14. The method of claim 12 wherein engaging the second surface of the piezoelectric device comprises engaging the second surface of the piezoelectric device with the second clamping member proximate the peripheral edge.

* * * * *